United States Patent
Chi et al.

(10) Patent No.: US 9,786,557 B1
(45) Date of Patent: Oct. 10, 2017

(54) TWO-DIMENSIONAL SELF-ALIGNED SUPER VIA INTEGRATION ON SELF-ALIGNED GATE CONTACT

(71) Applicants: International Business Machines Corporation, Armonk, NY (US); GlobalFoundries, Inc., Grand Cayman (KY)

(72) Inventors: Cheng Chi, Jersey City, NJ (US); Ruilong Xie, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/096,818

(22) Filed: Apr. 12, 2016

(51) Int. Cl.
| | |
|---|---|
| *H01L 21/4763* | (2006.01) |
| *H01L 21/768* | (2006.01) |
| *H01L 21/8234* | (2006.01) |
| *H01L 29/45* | (2006.01) |
| *H01L 29/417* | (2006.01) |
| *H01L 27/088* | (2006.01) |
| *H01L 23/528* | (2006.01) |
| *H01L 23/522* | (2006.01) |
| *H01L 23/532* | (2006.01) |
| *H01L 29/06* | (2006.01) |

(52) U.S. Cl.
CPC .. *H01L 21/76897* (2013.01); *H01L 21/76802* (2013.01); *H01L 21/76877* (2013.01); *H01L 21/823475* (2013.01); *H01L 23/528* (2013.01); *H01L 23/5226* (2013.01); *H01L 23/53209* (2013.01); *H01L 23/53228* (2013.01); *H01L 23/53257* (2013.01); *H01L 27/0886* (2013.01); *H01L 29/0649* (2013.01); *H01L 29/41766* (2013.01); *H01L 29/45* (2013.01)

(58) Field of Classification Search
USPC .................. 438/631, 740, 751, 924
See application file for complete search history.

(56) References Cited

U.S. PATENT DOCUMENTS

| | | |
|---|---|---|
| 5,081,516 A | 1/1992 | Haskell |
| 7,061,035 B2 | 6/2006 | Lian et al. |
| 7,378,700 B2 | 5/2008 | Lian et al. |
| 8,420,533 B2 | 4/2013 | Seidel et al. |
| 8,679,968 B2 | 3/2014 | Xie et al. |

(Continued)

*Primary Examiner* — Telly Green
(74) *Attorney, Agent, or Firm* — Cantor Colburn LLP; Vazken Alexanian

(57) ABSTRACT

Techniques relate to contacts for semiconductors. First gate contacts are formed on top of first gates, second gate contacts are on second gates, and terminal contacts are on silicide contacts. First gate contacts and terminal contacts are recessed to form a metal layer on top. Second gate contacts are recessed to be separately on each of the second gates. Filling material is formed on top of the recessed second gate contacts and metal layer. An upper layer is on top of the filling material. First metal vias are formed through filling and upper layers down to metal layer over first gate contacts. Second metal vias are formed through filling and upper layers down to metal layer over terminal contacts. Third metal vias are formed through filling and upper layers down to recessed second gate contacts over second gates. Third metal vias are taller than first.

14 Claims, 22 Drawing Sheets

(56) References Cited

U.S. PATENT DOCUMENTS

| | | |
|---|---|---|
| 9,184,095 B2 | 11/2015 | Scheiper et al. |
| 2013/0062323 A1 | 3/2013 | Hassan et al. |
| 2013/0062327 A1 | 3/2013 | Hsu et al. |
| 2014/0312500 A1 | 10/2014 | Zhu et al. |
| 2015/0069532 A1 | 3/2015 | Xie et al. |
| 2015/0097263 A1 | 4/2015 | Kim et al. |
| 2015/0270176 A1* | 9/2015 | Xie .................. H01L 21/76885 257/384 |

\* cited by examiner

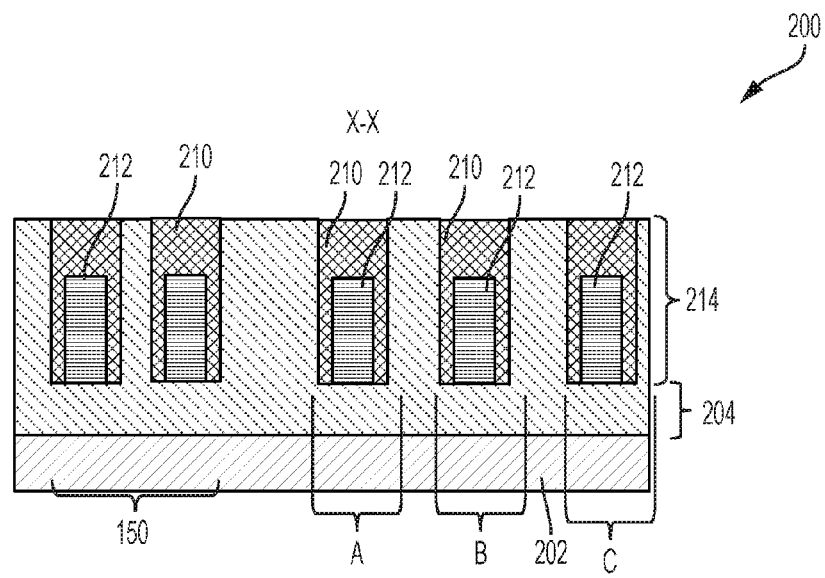
FIG. 2A
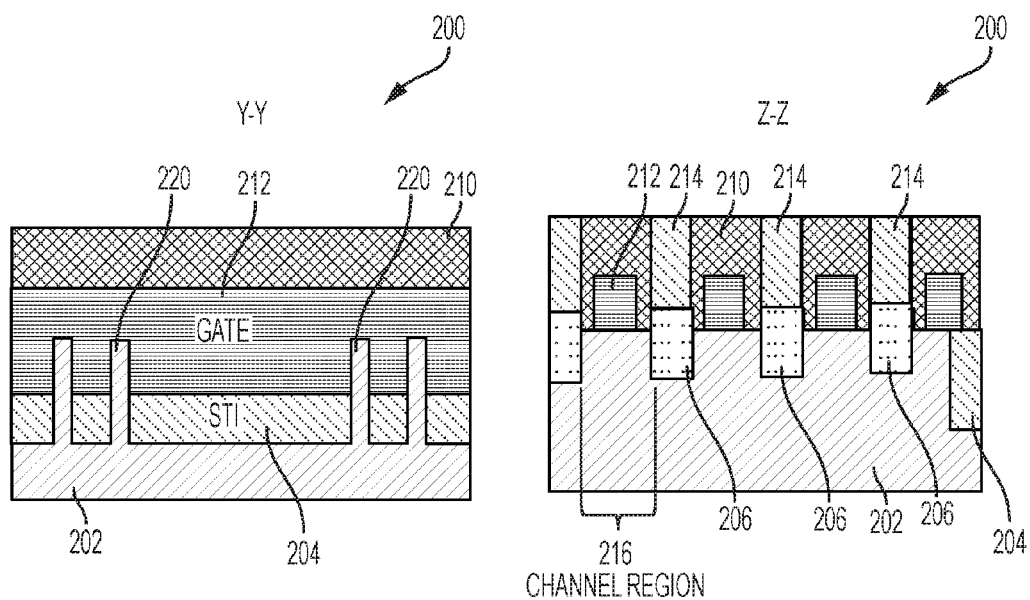
FIG. 2B
FIG. 2C

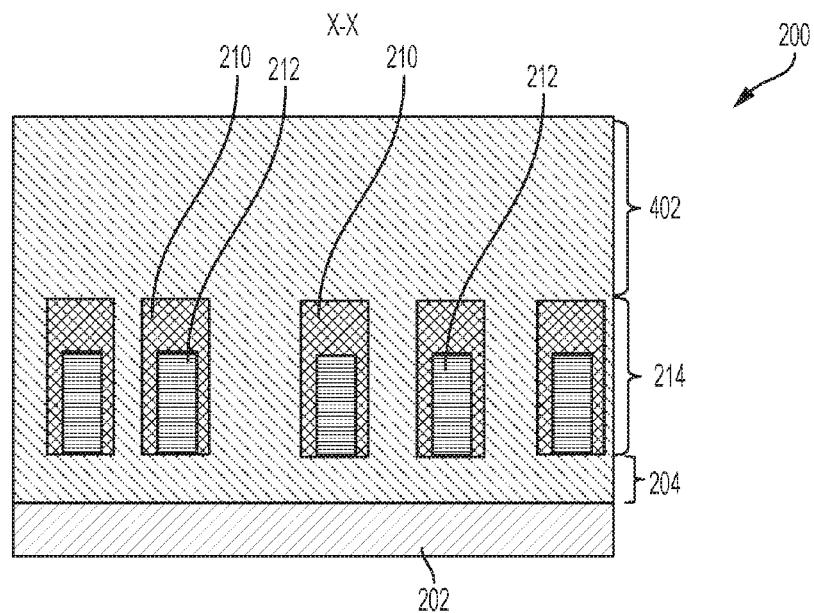
FIG. 4A
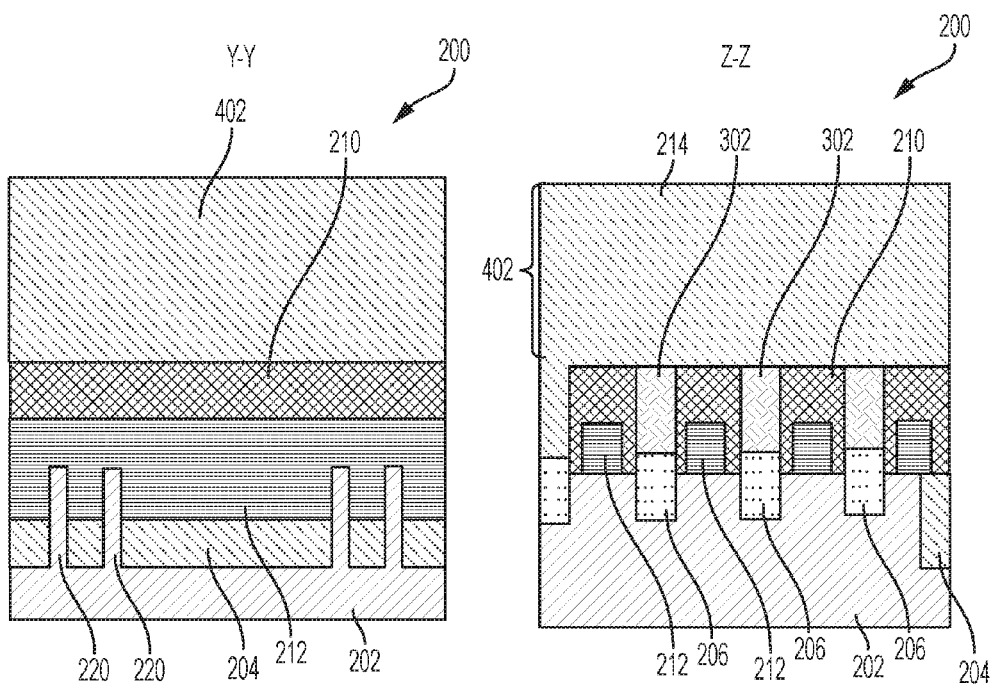
FIG. 4B
FIG. 4C

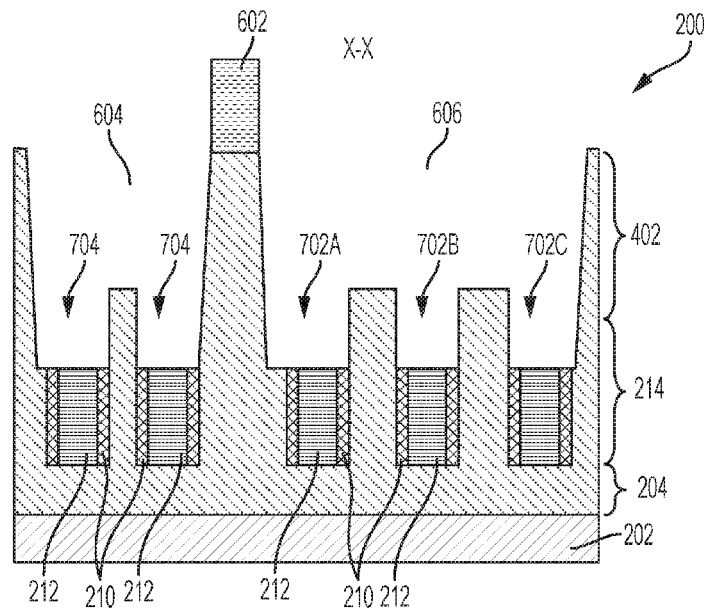
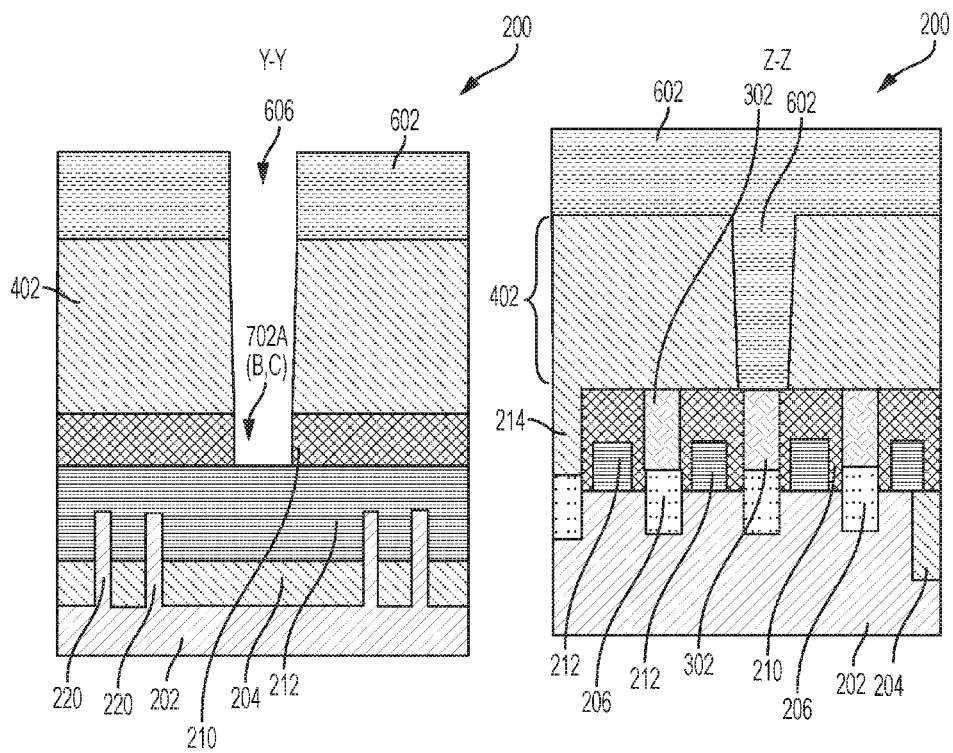
FIG. 7A
FIG. 7B
FIG. 7C

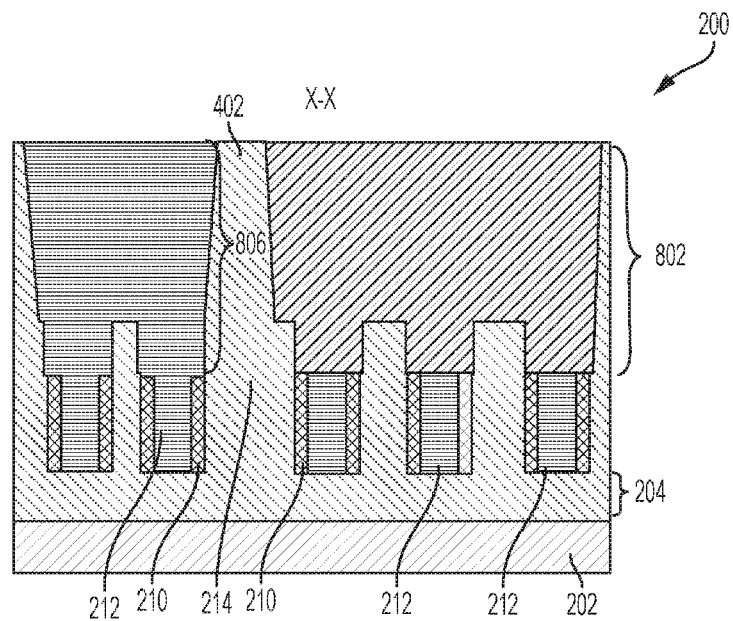
FIG. 8A
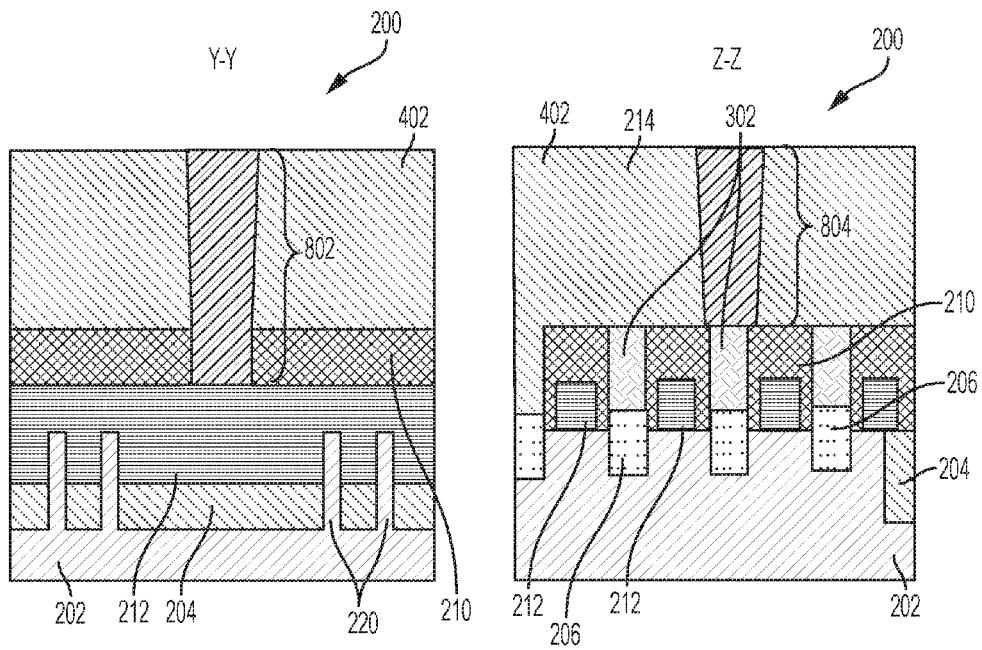
FIG. 8B
FIG. 8C

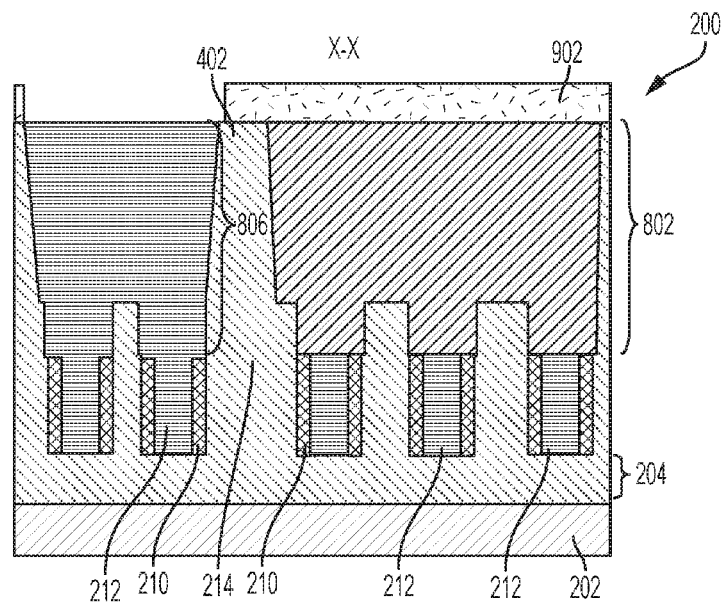
FIG. 9A
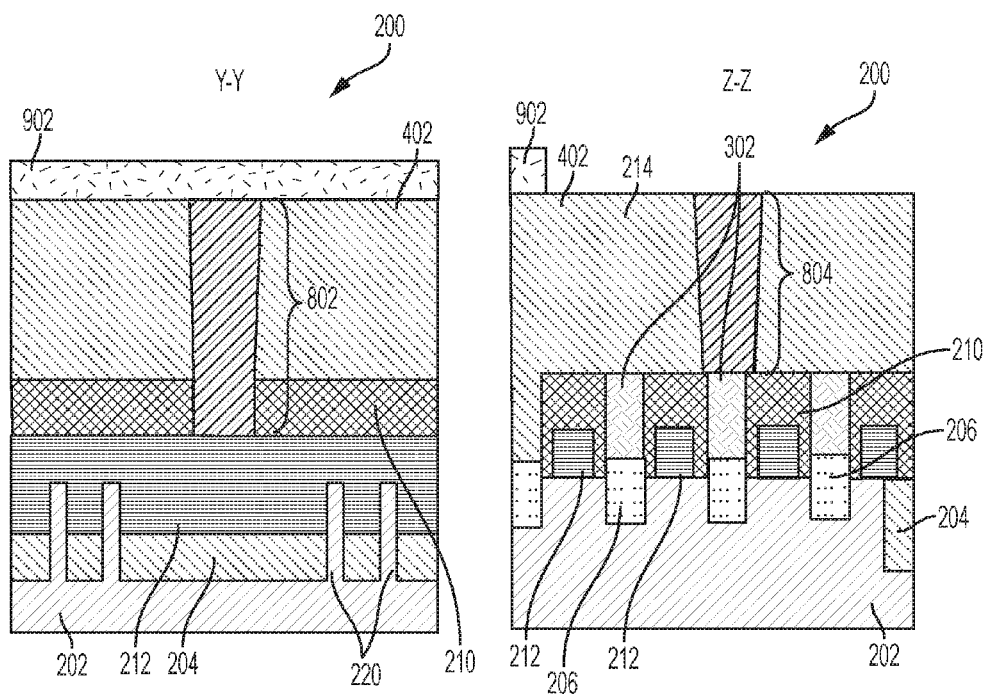
FIG. 9B
FIG. 9C

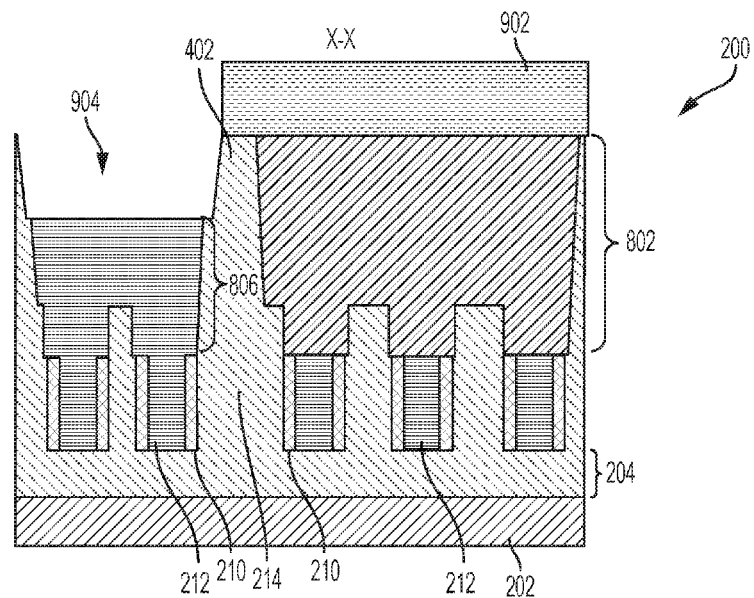
FIG. 10A
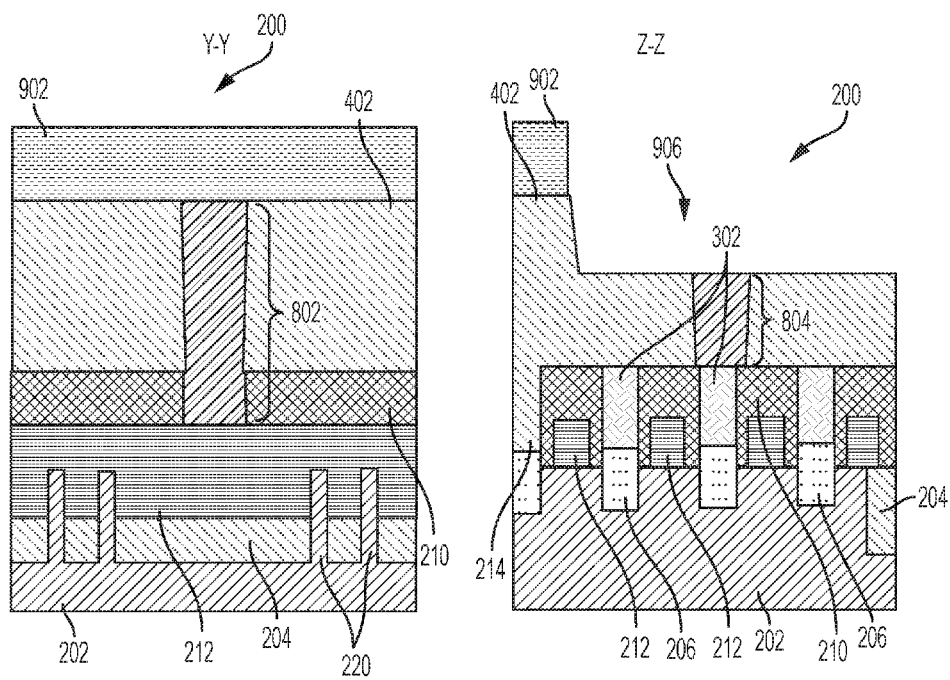
FIG. 10B
FIG. 10C

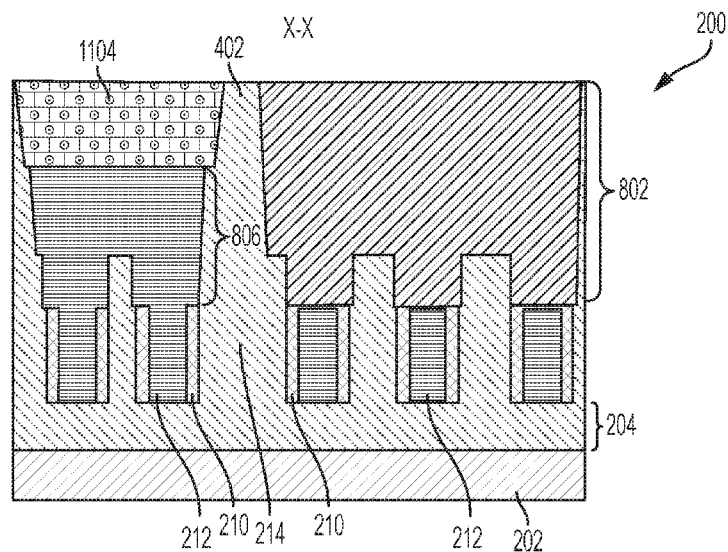
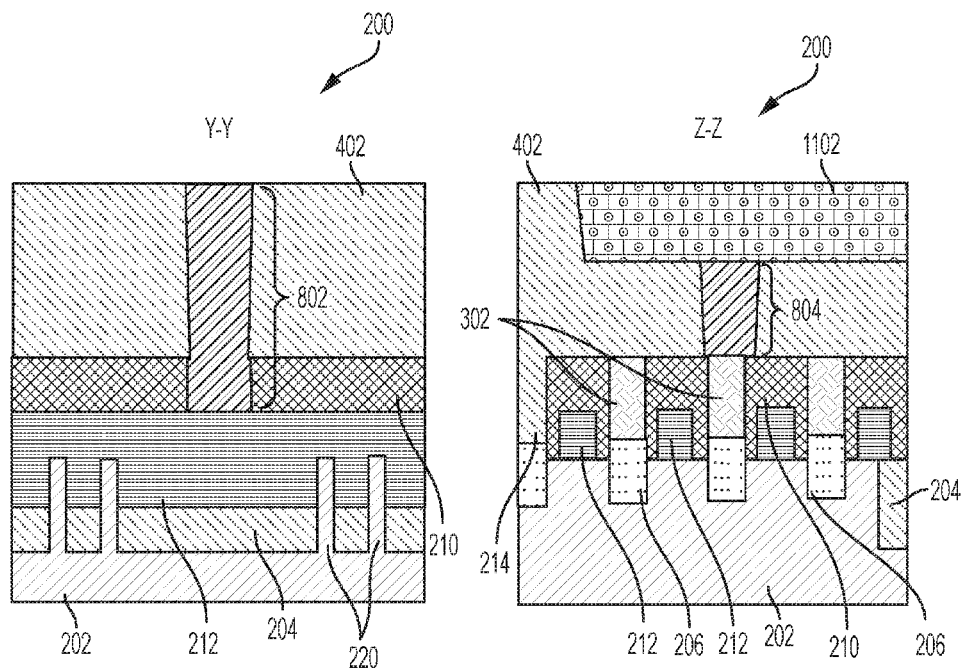

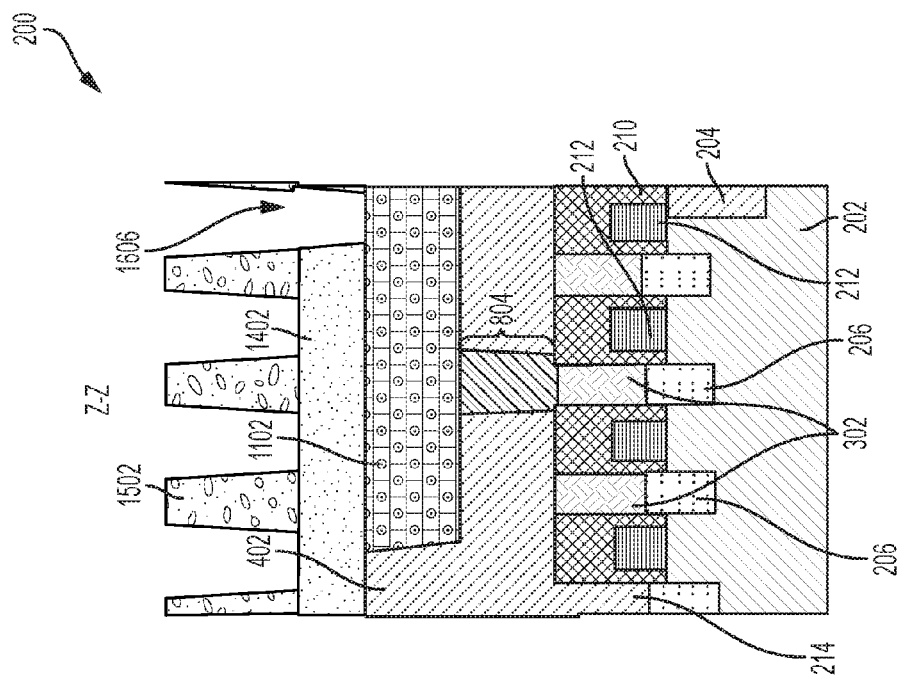
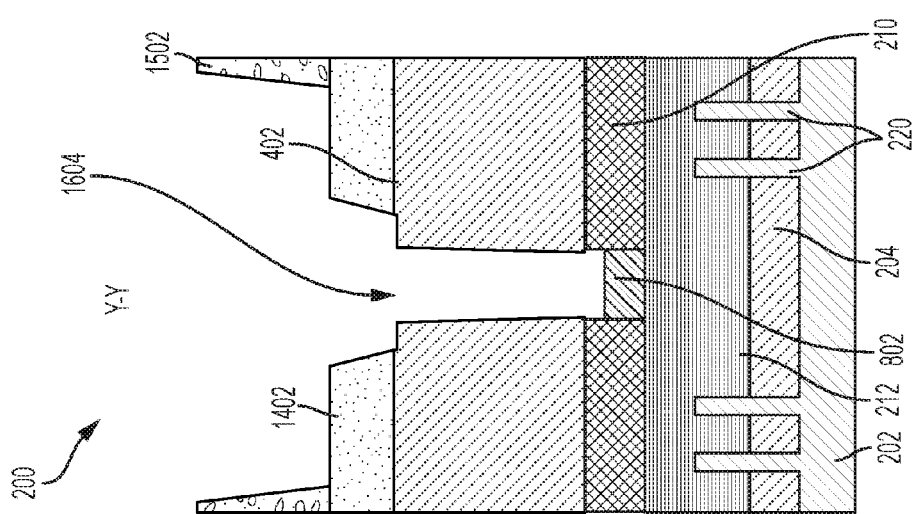

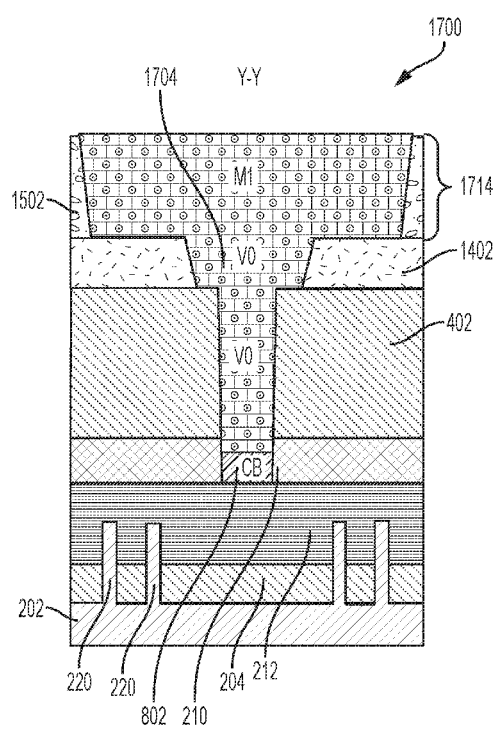
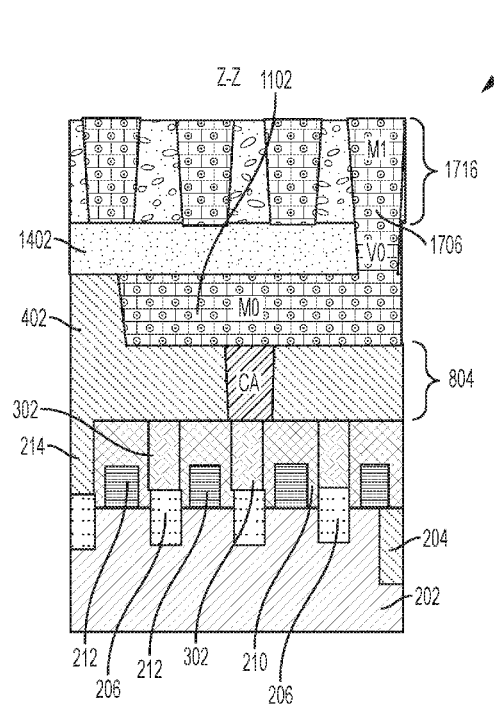
FIG. 17B
FIG. 17C

TWO-DIMENSIONAL SELF-ALIGNED SUPER VIA INTEGRATION ON SELF-ALIGNED GATE CONTACT

BACKGROUND

The present invention relates generally to integrated circuits, and more specifically, to providing a scheme on how to integrate two-dimensional self-aligned super via (tall via) (V0) on self-aligned gate contact metal layer.

The back end of line (BEOL) is the second portion of integrated circuit fabrication where the individual devices (transistors, capacitors, resistors, etc.) are interconnected with wiring on the wafer, i.e., the metallization layer. Common metals are copper interconnect and aluminum interconnect. BEOL generally begins when the first layer of metal is deposited on the wafer. BEOL includes contacts, insulating layers (dielectrics), metal levels, and bonding sites for chip-to-package connections.

General steps of BEOL may include silicidation of source/drain region usually considered as front end of line (FEOL) or middle of line (MOL). BEOL usually starts from material when copper (Cu) is used.

SUMMARY

According to one or more embodiments, a method of forming contacts for a semiconductor device. The method includes forming first gate contacts on top of first gates, second gate contacts on top of second gates, and terminal contacts on top of trench silicide contacts, where the trench silicide contacts are individually formed on top of sources and drains. Also, the method includes recessing the first gate contacts and the terminal contacts in order to form a metal layer on top of the first gate contacts and the terminal contacts, and recessing the second gate contacts such that recessed second gate contacts are separately on top of each of the second gates, where each of the recessed second gate contacts are separated from one another by a dielectric layer. Also, the method includes forming a filling material on top of the recessed second gate contacts and the metal layer and forming an upper layer on top of the filling material. The method includes forming first metal vias on top of the metal layer over the first gate contacts, according to a first via pattern through the filling material and the upper layer down to the metal layer on top of the first gate contacts. Further, the method includes forming second metal vias on top of the metal layer over the terminal contacts, according to a second via pattern through the filling material and the upper layer down to the metal layer on top of the terminal contacts. The method includes forming third metal vias on top of the recessed second gate contacts over the second gates, according to a third via pattern through the filling material and the upper layer down to the recessed second gate contacts. The third metal vias are taller than the first metal vias.

According to one or more embodiments, a method of forming contacts for a semiconductor device is provided. The method includes forming gate contacts on top of gates and recessing the gate contacts such that recessed gate contacts are separately on top of each of the gates. Each of the recessed gate contacts are separated from one another by a dielectric layer. The method includes forming a filling material on top of the recessed gate contacts and forming an upper layer on top of the filling material. Also, the method includes forming metal vias on top of the recessed gate contacts over the gates, according to a via pattern through the filling material and the upper layer down to the recessed gate contacts.

According to one or more embodiments, a semiconductor device is provided. The semiconductor device includes first gate contacts on top of first gates, second gate contacts on top of second gates, and terminal contacts on top of trench silicide contacts, where the trench silicide contacts are individually formed on top of sources and drains. The semiconductor device includes a metal layer on top of the first gate contacts and the terminal contacts, where the second gate contacts are recessed such that recessed second gate contacts are separately on top of each of the second gates, wherein each of the recessed second gate contacts are separated from one another by a dielectric layer. Also, the semiconductor device includes a filling material on top of the recessed second gate contacts and the metal layer, and an upper layer is on top of the filling material. First metal vias are formed on top of the metal layer over the first gate contacts, according to a first via pattern through the filling material and the upper layer down to the metal layer on top of the first gate contacts. Second metal vias are formed on top of the metal layer over the terminal contacts, according to a second via pattern through the filling material and the upper layer down to the metal layer on top of the terminal contacts. Third metal vias are formed on top of the recessed second gate contacts over the second gates, according to a third via pattern through the filling material and the upper layer down to the recessed second gate contacts. The third metal vias are taller than the first metal vias.

BRIEF DESCRIPTION OF THE DRAWINGS

FIGS. 2A, 2B, and 2C are cross-sectional views of an intermediate structure according to one or more embodiments.

FIGS. 4A, 4B, and 4C are cross-sectional views of the intermediate structure depicting deposition of an interlayer dielectric layer according to one or more embodiments.

FIGS. 7A, 7B, and 7C are cross-sectional views of the intermediate structure depicting further gate contact patterning to open a nitride layer according to one or more embodiments.

FIGS. 8A, 8B, and 8C are cross-sectional views of the intermediate structure depicting metallization of the source/drain (CA) contacts and gate (CB) contacts according to one or more embodiments.

FIGS. 9A, 9B, and 9C are cross-sectional views of the intermediate structure depicting M0 metal patterning according to one or more embodiments.

FIGS. 10A, 10B, and 10C are cross-sectional views of the intermediate structure depicting further M0 metal patterning according to one or more embodiments.

FIGS. 11A, 11B, and 11C are cross-sectional views of the intermediate structure depicting metallization of the M0 metal layer according to one or more embodiments.

FIGS. 16A, 16B, and 16C are cross-sectional views of the intermediate structure depicting V0 metal patterns according to one or more embodiments.

FIGS. 17A, 17B, and 17C are cross-sectional views of a final structure according to one or more embodiments.

DETAILED DESCRIPTION

Figure 1:
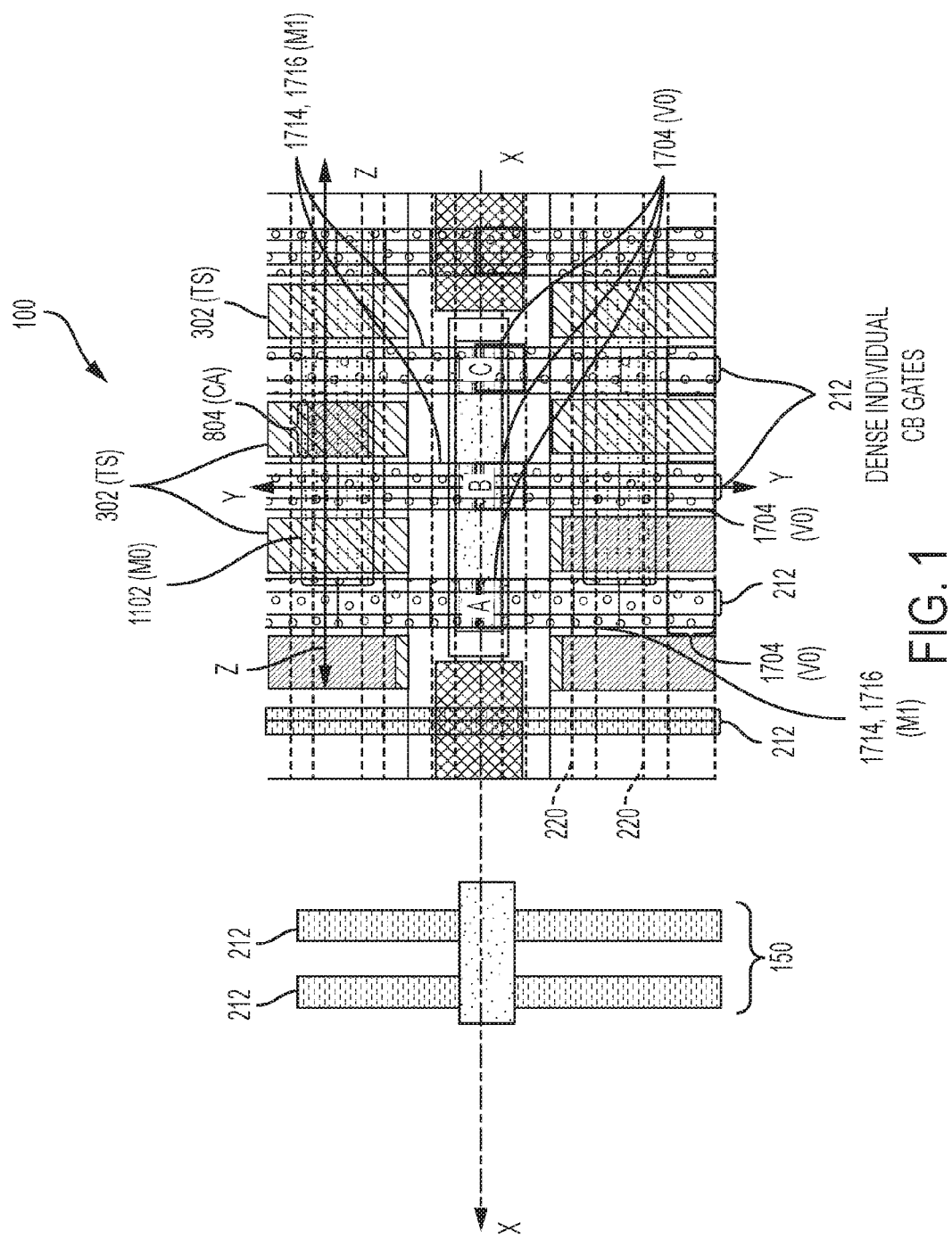
FIG. 1 is a top-down view of a schematic for an integrated circuit according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

As aggressive scaling occurs, for 7 nanometer (nm) technology node and below, to pattern gate contacts (CB) and via contacts on dense gates, merged self-aligned CB contact (gate open (GO) mask) and merged self-aligned V0 contact are needed. V0 refers to a metal via utilized as a contact.

However, for the middle-of-the-line (MOL) stack, there is a need to reduce the resistance between a source/drain (CA) contact and M0 contact, and the state-of-the-art scheme results in a very tall V0 metal layer, which creates a lot of process challenges and risks (in the state-of-the-art process). Also, introduction of the GO mask increases the mask count and thus increases the cost. To form the V0 metal layer, the state-of-the-art requires printing gate open (GO) contact for dense gates with dense contacts (critical mask), GO contact etch and metallization, additional interlayer dielectric deposition, printing CB contact for normal gates (critical mask), and CB contact etch and metallization.

Embodiments introduce a novel technique to form two-dimensional self-aligned tall via V0 contacts, which mitigates the above issues. Embodiments provide a novel technique to form a gate contact (CB) and fully self-aligned via (V0), without using an additional gate open (GO) mask. As such, a merged gate contact metal recess process is introduced followed by silicon nitride (SiN) fill. Embodiments are configured to decrease the GO mask count (i.e., the critical mask) as compared to the state-of-the-art.

One or more embodiments form short via (V0) contacts, and the short via contacts connect to the M0 metal contact below and the M1 metal contact. The M0 metal contact is connected to a gate contact. In contrast to the state-of-the-art, tall via (V0) contacts are formed in the SiN, and the tall via contacts individual connect gate contacts to the M1 metal contacts. In one or more embodiments, tall via contacts are utilized to contact the gate contacts without the M0 metal contact. The tall via contacts are individually formed through the SiN after recessing the gate contacts, such that each gate contacts has its own tall via contact. The tall via contacts are self-aligned to the both gate contacts below and the M1 metal contacts above. Further details are seen in the figures.

Figure 17A:
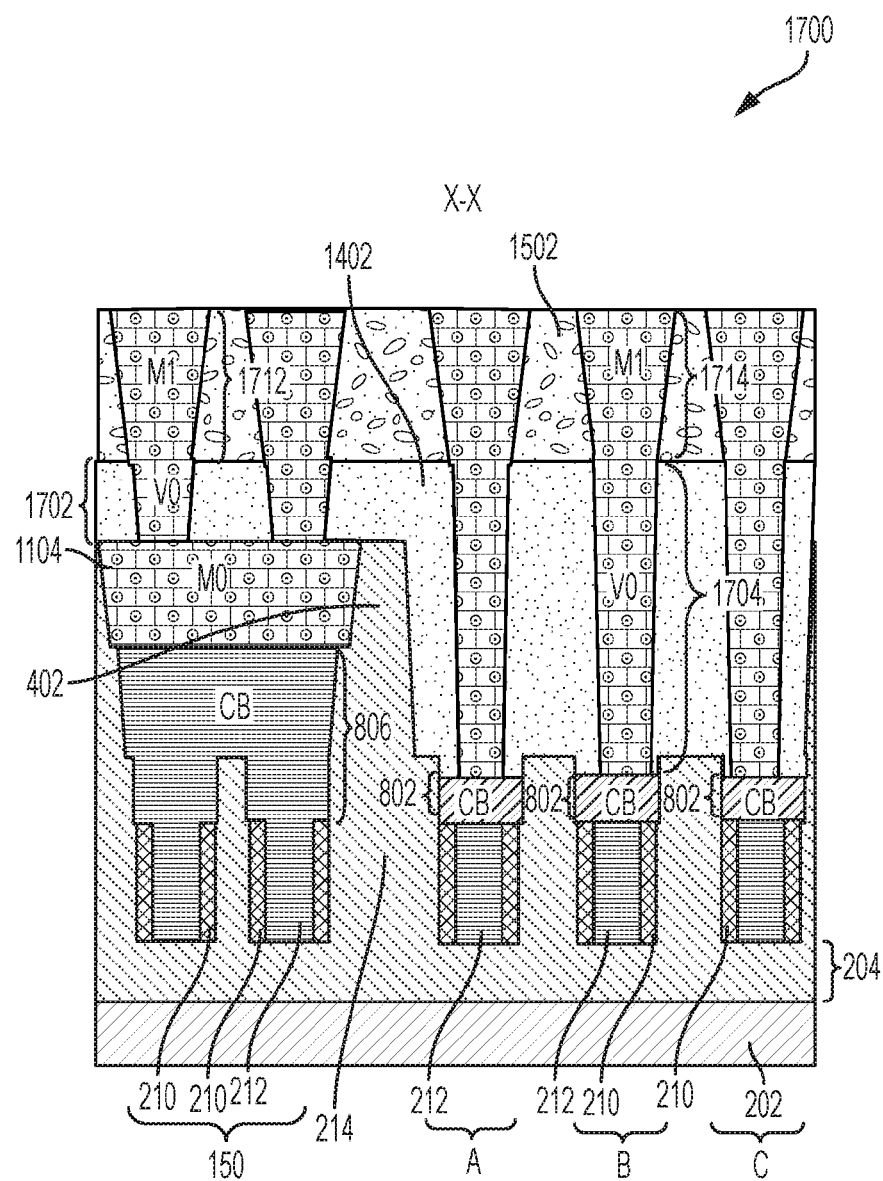

FIG. 1 is a top-down view of a schematic for an integrated circuit 100 according to one or more embodiments. The schematic of the integrated circuits 100 depicts many layers that have been formed. Metal layer 1704 is the (tall) V0 metal layer, which is a metal via. Reference can also be made to FIGS. 17A, 17B, and 17C as example cross-sectional views further illustrating the tall V0 metal layer 170 along with other elements as described further herein.

FIG. 1 also illustrates a trench silicide (TS) contact 302 and a metal layer 804. The metal layer 804 is a source and/or drain contact (CA). The source/drain contact (CA) is on top of the TS contact. Metal layer 1102 is an M0 metal layer. The M0 metal layer 1102 is on top of the source/drain (CA) contact 302.

Metal layer 1714, 1716 is an M1 metal layer. The M1 metal layer 1714 is on top of the tall V0 metal layer 1704. The M1 metal layer 1716 is on top of V0 metal layer 1706 (shown in the figures below).

Additionally, the integrated circuit 100 includes fins 220 and gates 212. Also, 3 gate locations A, B, C are identified which correspond to the gate locations A, B, C in FIG. 1. Portion 150 illustrates formation of part of the integrated circuit 100 (particularly 2 gates 212) in a manner that may not include some techniques of embodiments. The 2 gates 212 illustrated in portion 150 are less dense than the gates 212 at gate locations A, B, C. The gates 212 at gate locations A, B, C are dense because of their small gate pitch. In one implementation, the gate density at portion 150 may be as dense as gates 212 at gate locations A, B, C; the only difference here is that in portion 212 at gate locations A, B, C, there needs to be individual gate contacts and via contacts to connect those gates. However, in portion 150, the two gates are connected with a single common gate contact.

It should be appreciated that the integrated circuit 100 in FIG. 1 is a conceptual view and some details may not be explicitly shown in the layout. FIGS. 2-17 illustrate a fabrication process to build an integrated circuit, such as the integrated circuit 100, according to one or more embodiments. FIG. 1 shows line X-X, line Y-Y, and line Z-Z. The fabrication process for building the integrated circuit is illustrated from the perspective of cross-sectional views taken along the line X-X (FIGS. 2A-17A), line Y-Y (FIGS. 2B-17B), and line Z-Z (FIG. 2C-17B).

FIGS. 2A, 2B, and 2C are cross-sectional views of an intermediate structure 200 (for an integrated circuit) according to one or more embodiments. One or more fins 220 may be formed in a substrate 202 at desired locations using standard lithography processes. The substrate 202 may be a wafer, such as, e.g., a silicon wafer. The substrate may also include germanium, silicon germanium, etc.

One or more shallow trench isolations (STI) 204 are formed on the substrate 202 using standard lithography processes. The shallow trench isolations 204 prevent electric current leakage between adjacent semiconductor device components.

Source and drains 206 are formed in the substrate 202 using standard lithography processes. The sources and drains 206 may be p-type or n-type wells depending on the application, and the sources and drains 206 have a corresponding epitaxy layer on top.

An interlayer dielectric (ILD) layer 214 is formed on top of the shallow trench isolation areas 204 and on the top of the source and drains 206. The interlayer dielectric layer 214 may be an oxide layer. An example of the oxide layer 214 may be, e.g., silicon dioxide. In one implementation, the layer 214 may be flowable oxide, plasma-enhanced chemical vapor deposition (PECVD) oxide, etc.

Openings may be formed in the oxide layer 214 down to the substrate 202 in preparation for gates 212. Gates 212 are formed on the substrate 202 using standard lithography processes. The gates 212 may be high-κ metal gates. The gates 212 may include a high-κ material, such as, e.g., hafnium dioxide ($HfO_2$), zirconium dioxide ($ZrO_2$), and titanium dioxide ($TiO_2$), with a metal on top. The gates 212 are formed over the fins 220 as understood by one skilled in the art.

A layer 210 may be formed on top of the gates 212. The layer 210 may be a nitride, such as silicon nitride, silicon-borocarbonitride (SiBCN), etc. Chemical mechanical polishing/planarization may be performed on the intermediate structure 200 to form a level surface.

Figure 3A:
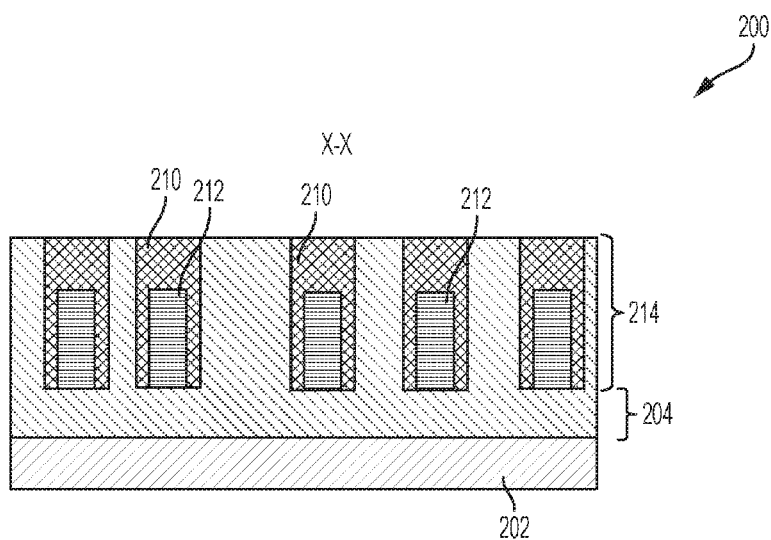
FIGS. 3A, 3B, and 3C are cross-sectional views of the intermediate structure depicting trench silicide (TS) contact formation according to one or more embodiments.
Figures 3B, 3C:
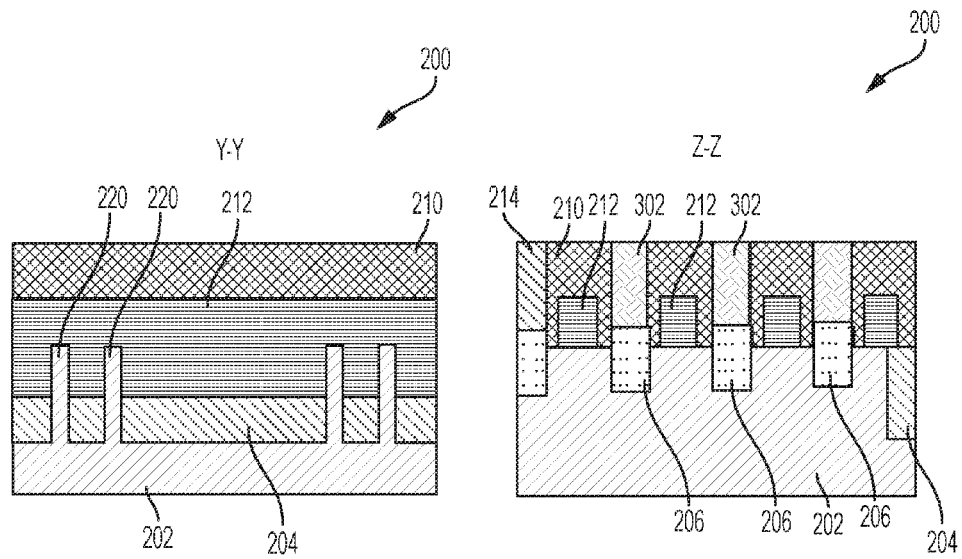

FIGS. 3A, 3B, and 3C are cross-sectional views of the intermediate structure 200 depicting trench silicide (TS) contact formation according to one or more embodiments. Portions of the oxide layer 214 have been removed above the sources and drains 206, e.g., according to a pattern (not shown). The oxide layer 214 may be removed by etching with an etchant designed to remove the oxide layer 214 but not the nitride layer 210. Trench silicide (TS) contacts 302 are formed on top of the sources and drains 206, and CMP processing is performed to level and smooth the top of the intermediate structure 200. The TS contacts 302 may include a silicide at the bottom and metallization material on top. The trench silicide contact 302 may include $WSi_2$, $TiSi_2$, NiSi, and $CoSi_2$. One example of forming the trench silicide contact 302 may include forming a metal on top of the source/drain 206 and then heating the intermediate structure 200 to form the trench silicide contact 302, and may include further filling the contact 302 with conductive metals such as tungsten (W) and cobalt (Co) and/or with liner or barrier metal liners such as titanium nitride (TiN).

FIGS. 4A, 4B, and 4C are cross-sectional views of the intermediate structure 200 depicting deposition of another interlayer dielectric layer 402 according to one or more embodiments. The interlayer dielectric layer 402 is formed on top of the nitride layer 210, the interlayer dielectric layer 214, and the trench silicide contact 302 using standard lithography processes. The interlayer dielectric layer 402 may be an oxide layer. In one implementation, the material of the interlayer dielectric layer 402 may be the same as layer 214. In one implementation, the layers 402, 214, and 204 may be or include the same material.

Figure 5A:
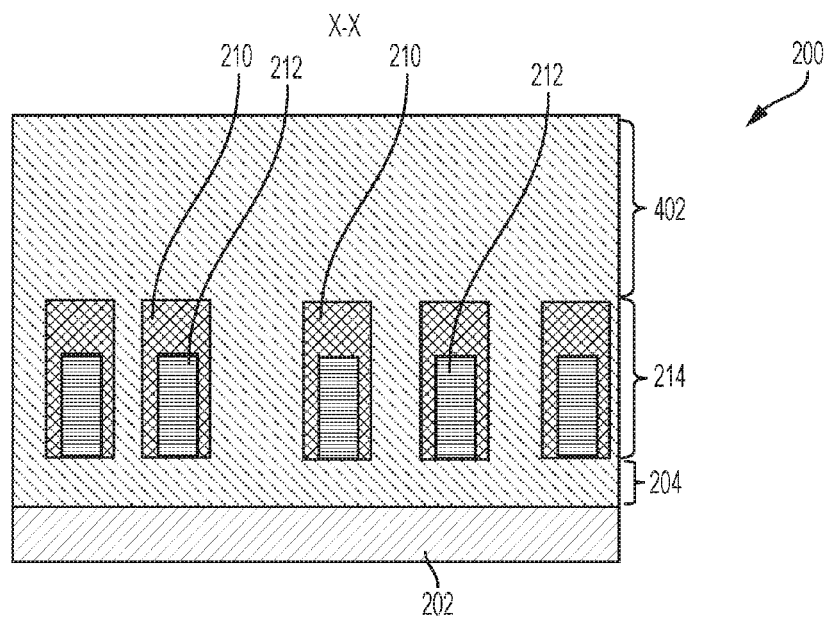
FIGS. 5A, 5B, and 5C are cross-sectional views of the intermediate structure depicting contact etching according to one or more embodiments.
Figures 5B, 5C:
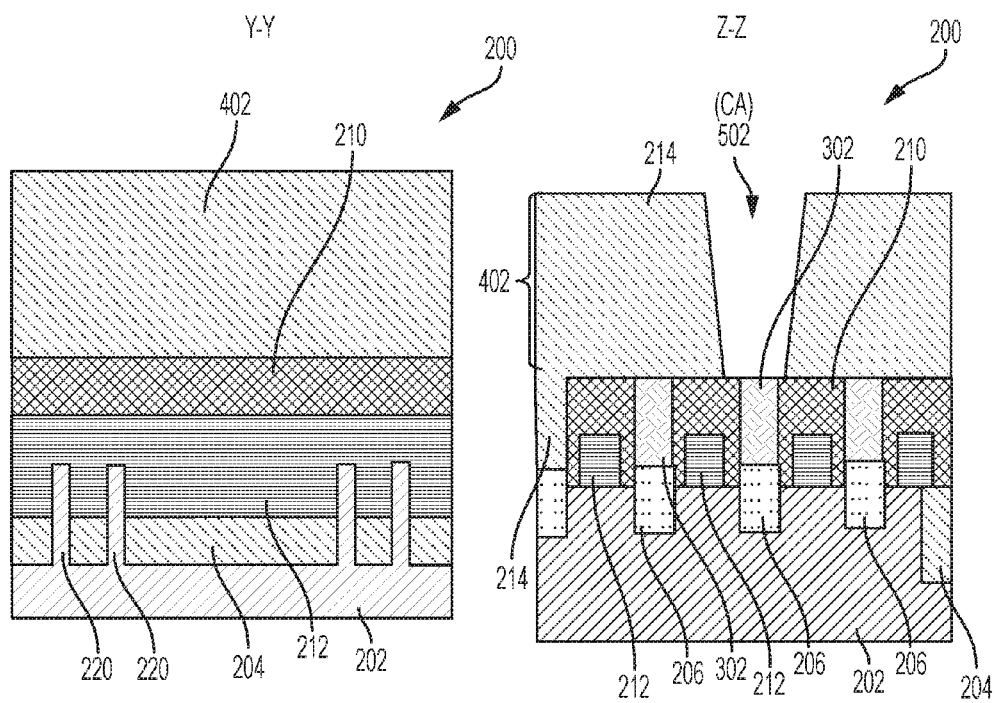

FIGS. 5A, 5B, and 5C are cross-sectional views of the intermediate structure 200 depicting contact etching (CA) according to one or more embodiments. A contact pattern/trench 502 is cut into the interlayer dielectric layer 402 of the intermediate structure 200 above the trench silicide contact 302. The contact trench 502 is etched in preparation for source/drain contacts (CA contact).

Figure 6A:
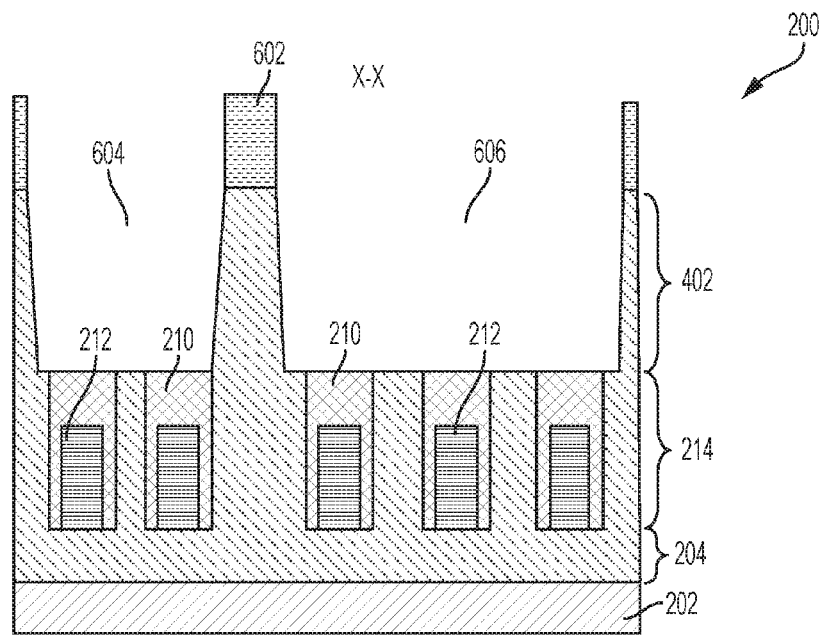
FIGS. 6A, 6B, and 6C are cross-sectional views of the intermediate structure depicting gate contact patterning according to one or more embodiments.
Figures 6B, 6C:
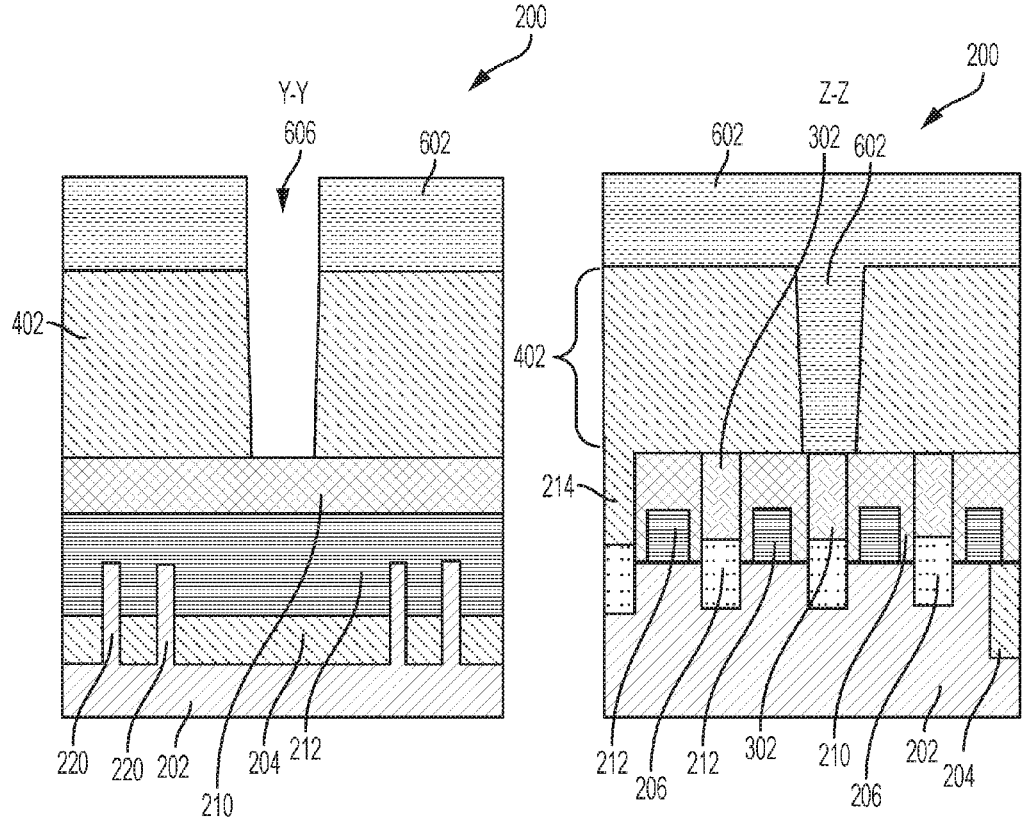

FIGS. 6A, 6B, and 6C are cross-sectional views of the intermediate structure 200 depicting gate contact patterning according to one or more embodiments. For example, organic planarizing layer (OPL) 602 is formed on top of the interlayer dielectric layer 402. Patterns are etched in the organic planarizing layer 602 and correspondingly etched into the interlayer dielectric layer 402 as gate contact patterns 604 and 606. The gate contact patterns 604 and 606 expose the tops of the nitride layer 210 (that cover the gates 212). The gate contact pattern 604 is for a normal (CB) gate contact. The gate pattern 606 is for the merged CB gate contact for 3 individual gates (or more than 3). The organic planarizing layer 602 fills in the contact pattern/trench 502. This process is achieved by standard lithography processes.

Also, material of the organic planarizing layer 602 may be some other hardmask material (e.g., TiN), which is formed by lithography patterning and pattern transfer, especially when multiple litho/etch processes are used. In one implementation, the organic planarizing layer 602 may be deposited on the top surface of the intermediate structure 200, and the organic planarizing layer 602 is etched into the desired shape.

In FIGS. 6A, 6B, and 6C, there is no need to utilize a separated gate open (GO) mask. It should be appreciated that a block mask is to be utilized in FIGS. 12A-12C and 13A-13C as discussed below.

FIGS. 7A, 7B, and 7C are cross-sectional views of the intermediate structure 200 depicting further gate contact patterning to open the silicon nitride according to one or more embodiments. Gate contact patterns 702A, 702B, 702C are formed in the nitride layer 210 to expose the tops of the gates 212 in the merged CB contact pattern 606. Similarly, gate contact patterns 704 are formed in the nitride layer 210 to expose the tops of the gates 212 in the normal CB gate pattern.

FIGS. 8A, 8B, and 8C are cross-sectional views of the intermediate structure 200 depicting metallization of the source/drain (CA) contacts and gate (CB) contacts according to one or more embodiments. The organic planarizing layer 602 is stripped off, and the metal layer is deposited on the intermediate structure 200 to fill the various trenches/patterns. For ease of understanding, the metal layer is designated as metal layers 802, 804, and 806.

The metal layer 806 is formed on top of the gates 212 and nitride layer 210 within the gate contact patterns 704 in pattern 604.

The metal layer 802 is formed on top of the gates 212 and nitride layer 210 within the gate contact patterns 702A, 702B, 702C in pattern 606.

The metal layer 804 is formed on top of the trench silicide contact 302. The metal layer 804 may also be on top of portions of the nitride layer 210 on the sides of the trench silicide contact 302.

The metal layers 802 and 806 are CB gate contacts. The metal layer 804 is CA source/drain contacts. The metal layers 802, 804, and 806 may include metals, e.g., such as cobalt (Co), tungsten (W), and copper (Cu), and may include metal liners such as Ti/TiN.

FIGS. 9A, 9B, and 9C are cross-sectional views of the intermediate structure 200 depicting M0 metal patterning according to one or more embodiments. For example, organic planarizing layer (OPL) 902 is formed on top of the interlayer dielectric layer 402. Patterns are etched in the organic planarizing layer 602 such that the metal layers 804 and 806 are exposed, all of which is in preparation for depositing the M0 metal layer. Also, the metal layer 802 remains covered because no M0 metal layer is to be deposited on the metal layer 802.

FIGS. 10A, 10B, and 10C are cross-sectional views of the intermediate structure 200 depicting further M0 metal patterning to open the interlayer dielectric layer and remove part of the gate contact and the source/drain contact according to one or more embodiments. M0 metal patterns 904 and 906 are formed in the interlayer dielectric layer 402 and in upper portions of the metal layers 804 (CA source/drain contacts) and 806 (CB gate contacts). In preparation for depositing the M0 metal layer, M0 metal pattern 904 exposes the top of the metal layer 806 (CB gate contact), and M0 metal pattern 906 exposes the top of the metal layer 804 (CA source/drain contact). In one implementation, the interlayer dielectric layer 402 may be oxide material and an oxide etch is performed to form the M0 metal patterns 904 and 906, along with etching the material (W, Co, and/or Cu) of the metal layers 804 and 806. The metal layer 802 (CB gate contact) remains covered by the organic planarizing layer 902 and is thus protected.

FIGS. 11A, 11B, and 11C are cross-sectional views of the intermediate structure 200 depicting M0 metallization of the M0 metal layer according to one or more embodiments. It can be seen that M0 metal layer 1102 is deposited to fill the M0 metal pattern 906 (in FIG. 12) and that the M0 metal layer 1104 is deposited to fill the M0 metal pattern 904. Chemical mechanical polishing/planarization is performed to level the top surface of the intermediate structure 200.

Figure 12B:
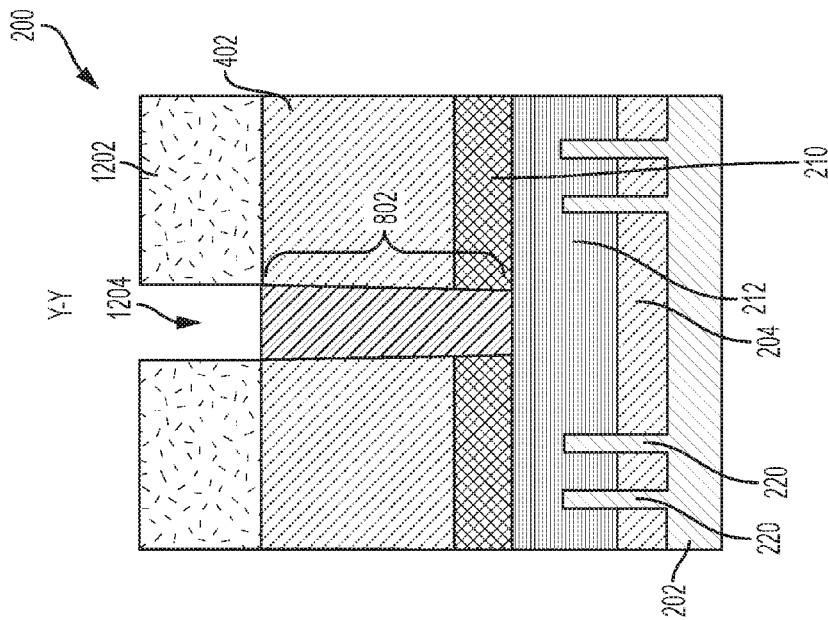
FIGS. 12A, 12B, and 12C are cross-sectional views of the intermediate structure depicting a block mask to open the merged CB (gate) contact according to one or more embodiments.
Figure 12A:
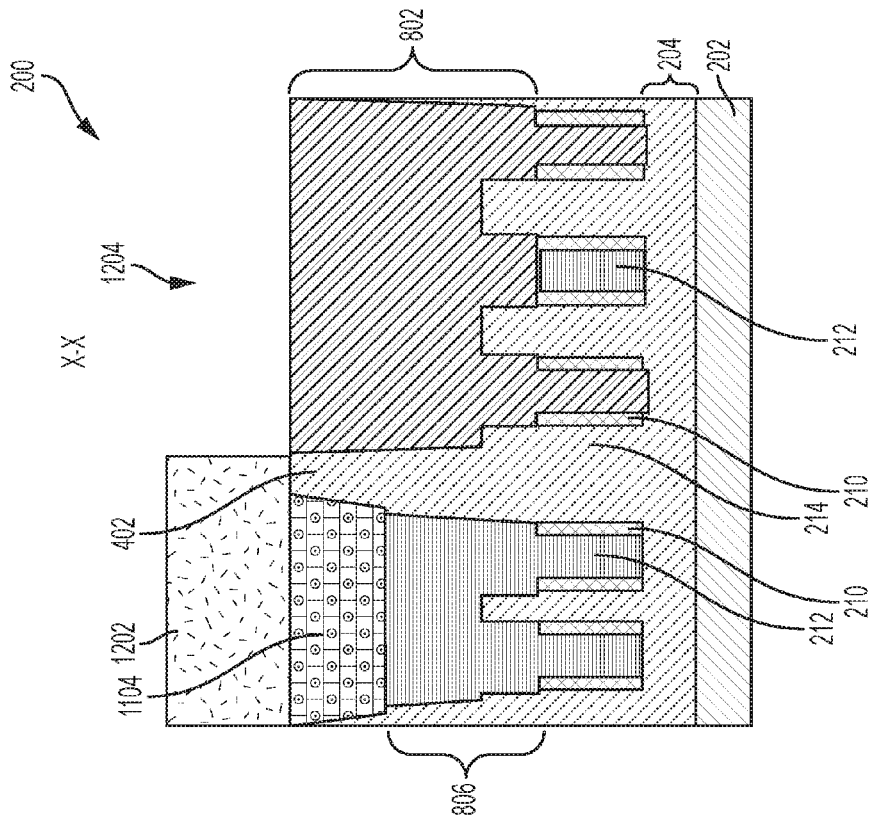
Figure 12C:
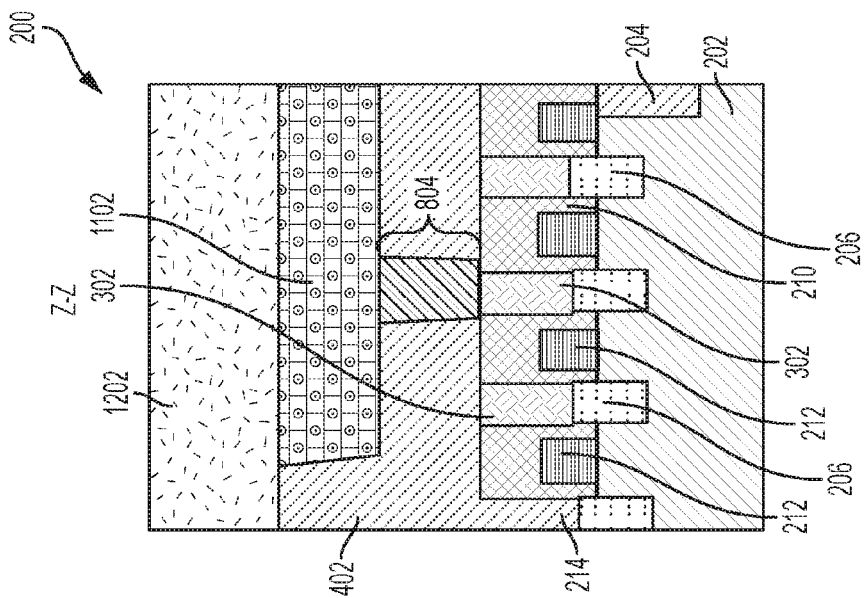

FIGS. 12A, 12B, and 12C are cross-sectional views of the intermediate structure 200 depicting a block mask to open the merged CB (gate) contact according to one or more embodiments. The block mask includes the etched organic planarizing layer 1202 deposited on top of the intermediate structure 200 and etched into the pattern 1204. The pattern 1204 exposes the tops of the metal layer 802 (CB gate contact), while protecting the M0 metal layers 1102 and 1104. The block mask of the organic planarizing layer 1202 is cheaper (better) than a G0 mask and requires fewer processing steps. Furthermore, the lithography process using the block mask is cheaper because the block mask is a non-critical mask. Being a non-critical mask means that the block mask cost will be much cheaper, the feature of the block mask is larger and shape is simpler, and the block mask does not need a lot of design effort and optical proximity correction (OPC). Also, the processing cost is cheaper, because the block mask may be printed in older lithography tools, while the critical mask needs most advanced immersion tools, even with multiple patterning or extreme ultraviolet lithography (EUV) tool.

Figure 13A:
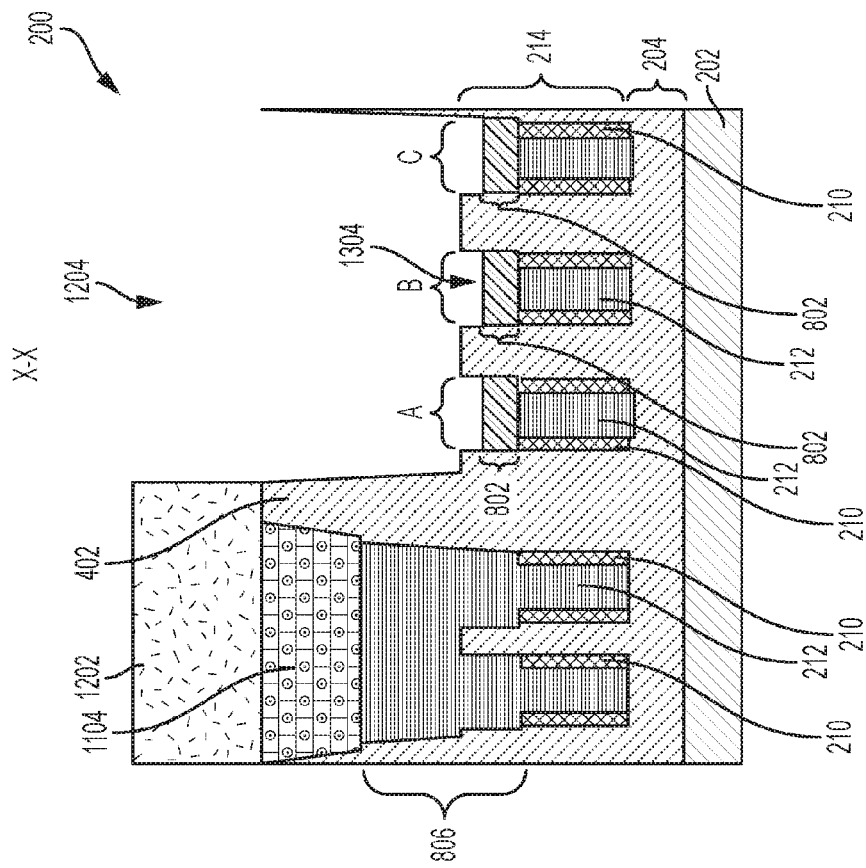
FIGS. 13A, 13B, and 13C are cross-sectional views of the intermediate structure depicting recessing the metal layer (merged CB gate contact) according to one or more embodiments.
Figure 13C:
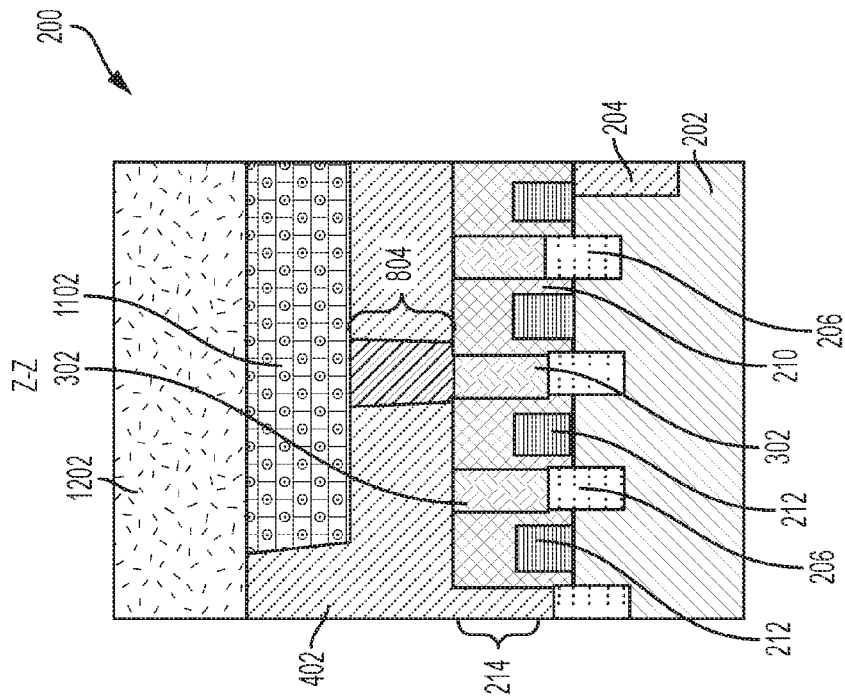
Figure 13B:
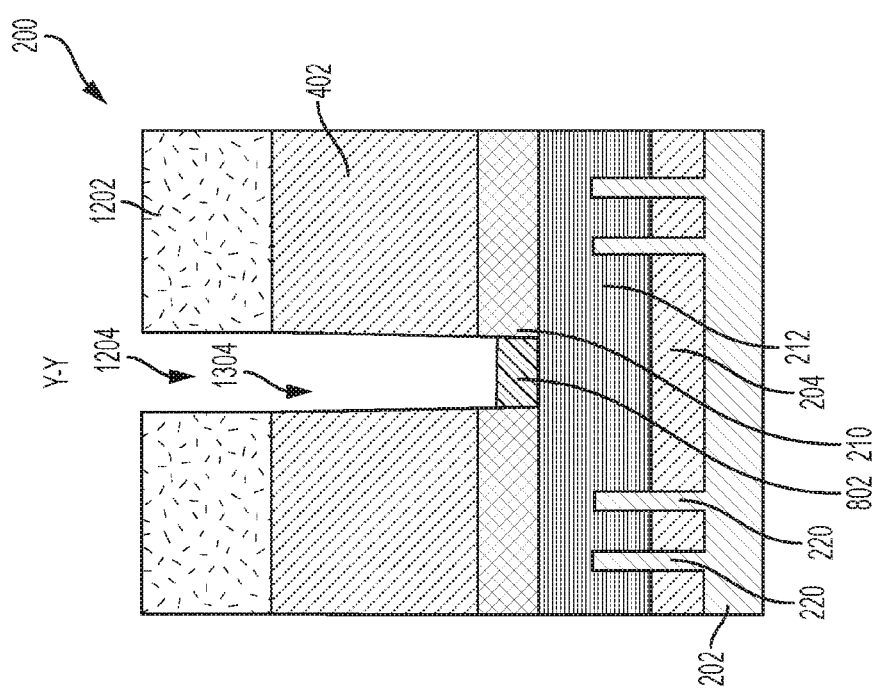

FIGS. 13A, 13B, and 13C are cross-sectional views of the intermediate structure 200 depicting recessing the metal layer to form pattern 1304 according one or more embodiments. Within the pattern 1204, the upper portion of the metal layer 802 is etched to only leave a short portion of the metal layer 802 above the gate 212 and nitride layer 210 in the pattern 1204. By recessing the metal layer 802 to thereby form pattern 1304, each gate location A, B, C is separated (physically and electrically) from one another such that the gates 212 are no longer (electrically) connected together by the metal layer 802; accordingly, each gate 212 in each gate location A, B, C has its own short portion (CB gate contact) of the metal layer 802. Although only 3 gate locations A, B, C are shown for illustrative purposes, it should be appreciated that more than 3 gate locations may be generated according to the techniques discussed herein.

Figure 14A:
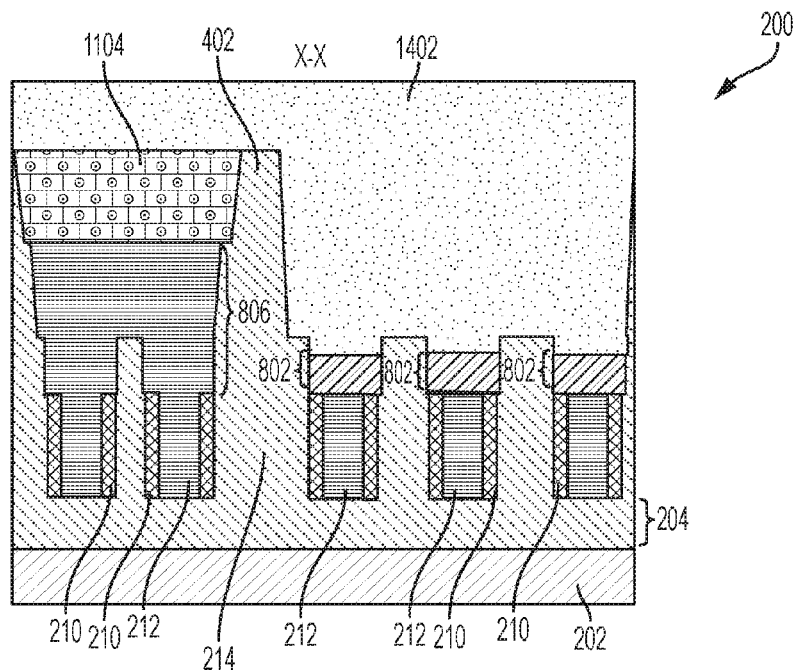
FIGS. 14A, 14B, and 14C are cross-sectional views of the intermediate structure depicting removal of the organic planarizing layer and addition of a filling material according to one or more embodiments.
Figures 14B, 14C:
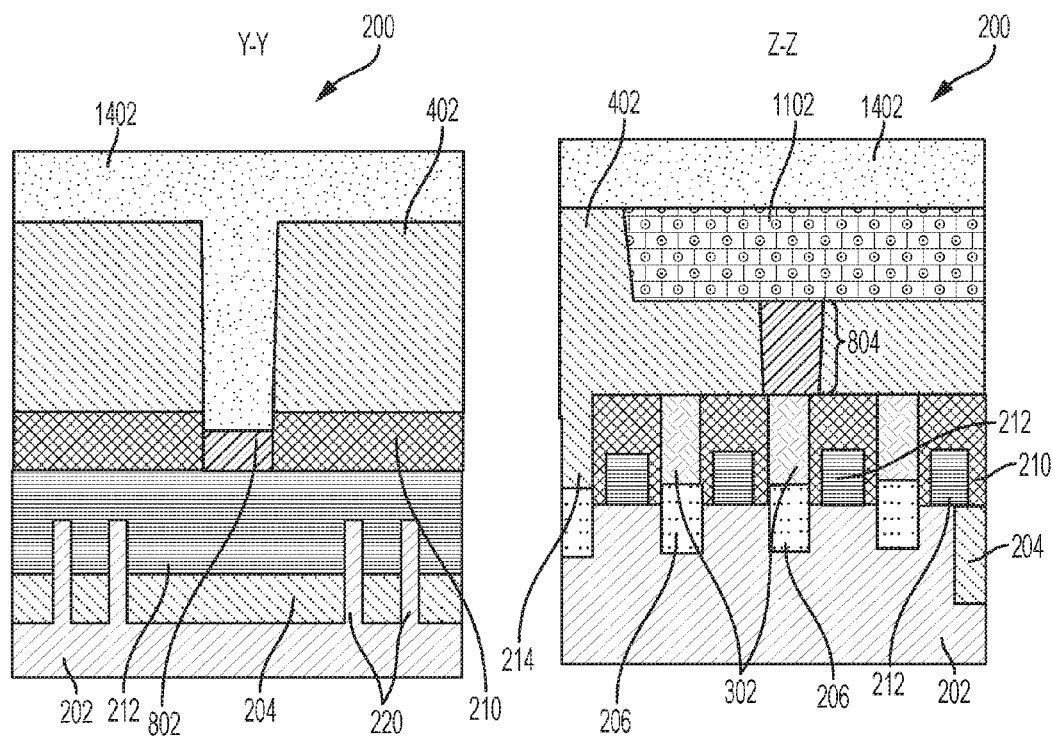

FIGS. 14A, 14B, and 14C are cross-sectional views of the intermediate structure 200 depicting removal of the organic planarizing layer 1202 and addition of a filling material according to one or more embodiments.

The organic planarizing layer 1202 is stripped off and filling material 1402 is deposited on the intermediate structure 200. The filling material 1402 fills the pattern 1304 and covers the respective short portions of the metal layer 802. Also, the M0 metal layers 1102 and 1104 are covered by the filling material 1402.

The filling material 1402 may be a nitride. In one implementation, examples of the filling material 1402 may include silicon nitride (SiN). The filling material 1402 is designed to be utilized to define the V0 metal landing as discussed further below.

Figure 15B:
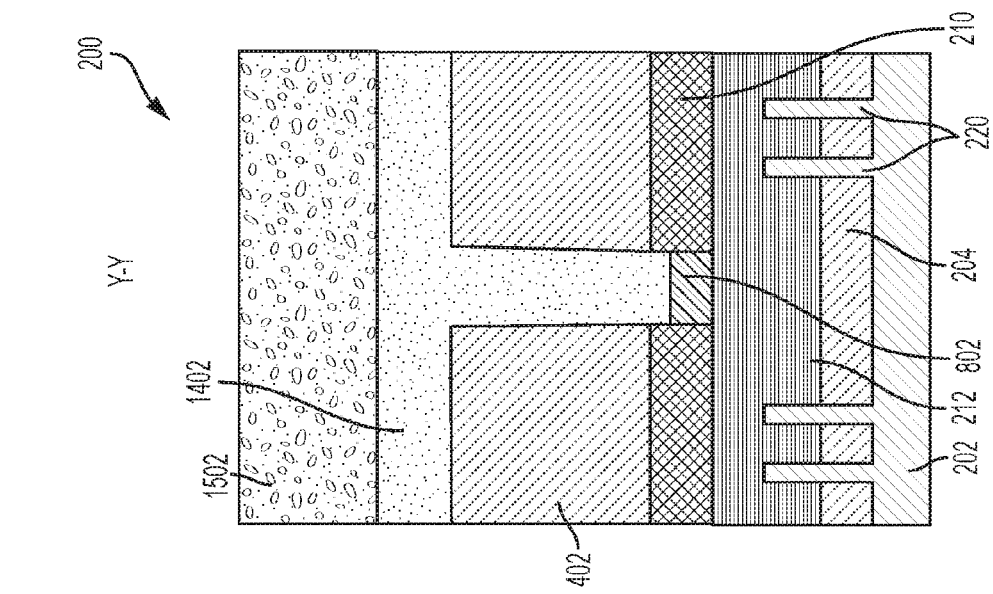
FIGS. 15A, 15B, and 15C are cross-sectional views of the intermediate structure depicting deposition of an upper layer according to one or more embodiments.
Figure 15A:
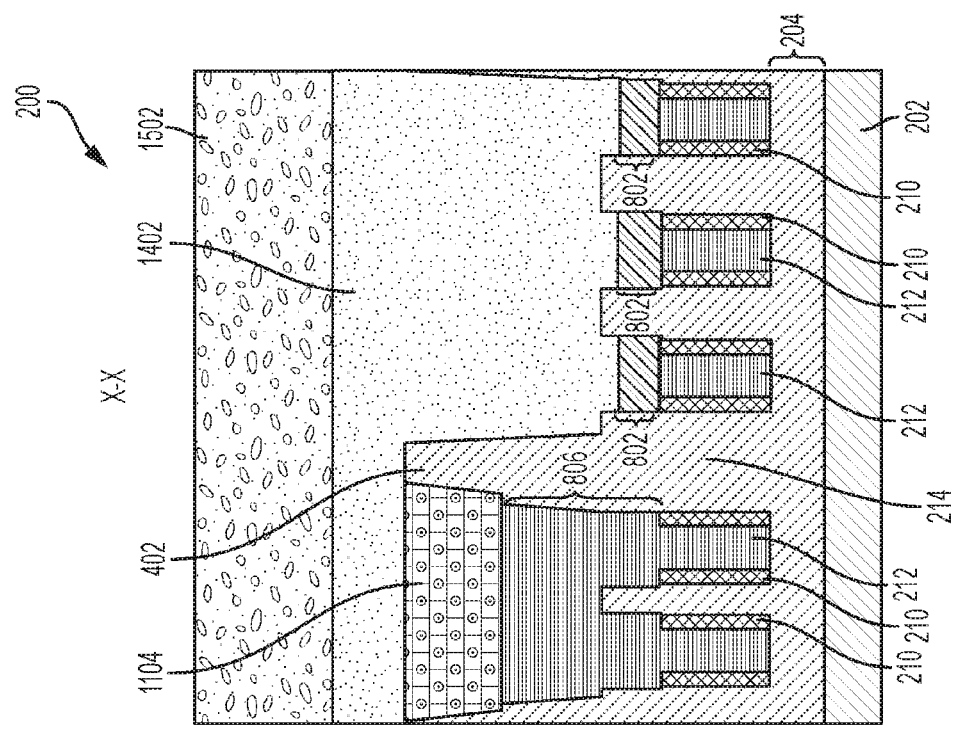
Figure 15C:
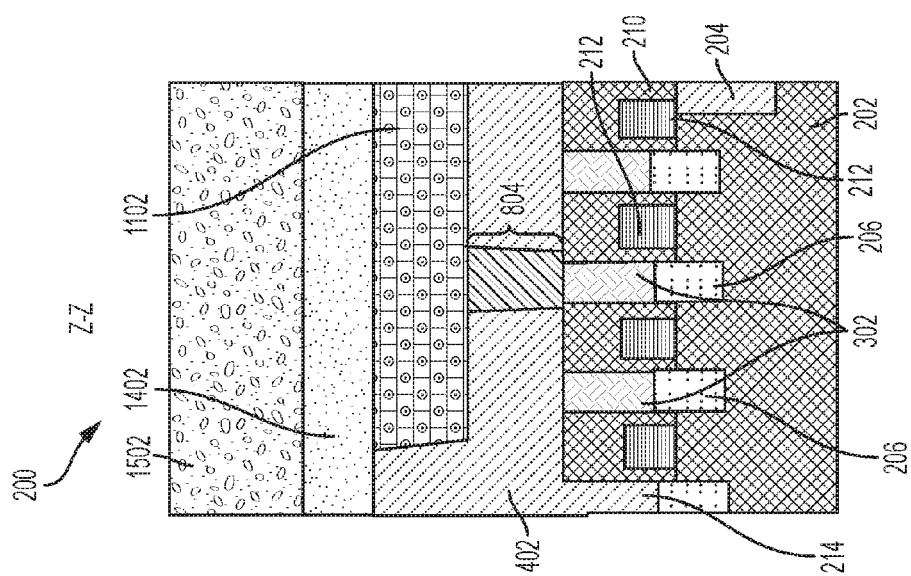

FIGS. 15A, 15B, and 15C are cross-sectional views of the intermediate structure 200 depicting deposition of an upper layer according to one or more embodiments. An upper layer 1502 is deposited on top of the filling material 1402. In one implementation, the upper layer 1502 may be a (ultra) low-k dielectric material.

In one case, low-k dielectric materials may include dielectric materials with a dielectric constant k) lower than about 4.2.

Figure 16A:
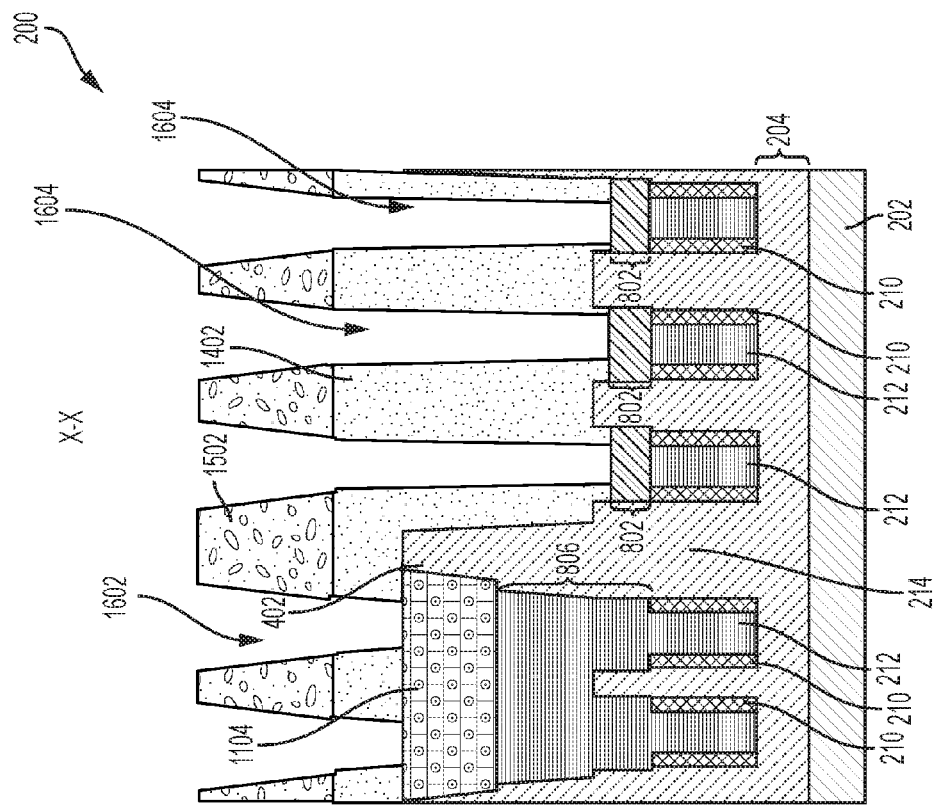

FIGS. 16A, 16B, and 16C are cross-sectional views of the intermediate structure 200 depicting V0 metal patterns (along with M1 metal patterns) according to one or more embodiments. V0 metal patterns 1602, 1604, and 1606 are formed in the upper layer 1502 and the filling material 1402.

The V0 metal pattern 1602 includes trenches formed down to the M0 metal layer 1104. The V0 metal pattern 1602 is patterned for one-dimensional self-aligned short V0 metal vias. The one-dimensional self-aligned via is self-aligned to top M1 line (self-aligned to M1 line minor axis) which is discussed below.

The V0 metal pattern 1604 includes trenches formed down to the metal layer 802. The V0 metal pattern 1604 is patterned to form two-dimensional self-aligned tall V0 metal vias. The two-dimensional self-aligned via is self-aligned to both top M1 line (self-aligned to M1 line minor axis), and also self-aligned to bottom CB line (self-aligned to merged CB line minor axis) as discussed below.

The V0 metal pattern 1606 includes trenches formed down to the M0 metal layer 1102.

FIGS. 17A, 17B, and 17C are cross-sectional views of a final structure 1700 according to one or more embodiments. The final structure 1700 is an integrated circuit, such as, e.g., the integrated circuit 100.

Metal is deposited to fill in the patterns 1602, 1604, and 1606, thereby forming V0 metal vias with M1 metal layers on top.

For pattern 1602 exposing M0 metal layer 1104 (in FIGS. 16A-16C), the deposited metal forms (short) V0 metal vias 1702 with an M1 metal layer 712 on top. The V0 metal vias 1702 connect the M0 metal layer 1104 to the M1 metal layer 1712.

For pattern 1604 exposing the short portions (CB gate contact) of the metal layer 802 (in FIGS. 16A-16C), the deposited metal forms (tall) V0 metal vias 1704 with an M1 metal layer 1714 on top. The V0 metal vias 1704 respectively connect each short portion of the metal layer 802 (i.e., each CB gate contact) to an individual M1 metal layer 1714. The V0 metal vias 1704 are self-aligned in two dimensions. For example, V0 metal vias 1704 are self-aligned to both "across top metal direction" of the M1 metal layer 1714 and "across bottom metal direction" of the CB gate 802, thereby having alignment connecting bottom metal to top metals.

In one implementation, the height of the (short) V0 metal layer 1702 may range from about 20-40 nanometers (nm). In one implementation, the height of the (tall) V0 metal layer 1704 may range from about 60-100 nm.

For pattern 1606 exposing the M0 metal layer 1102 (in FIGS. 16A-16C), the deposited metal forms V0 metal vias 1706 with an M1 metal layer 1716 on top. The V0 metal via 1706 connects the M0 metal layer 1102 to the M1 metal layer 1716.

The M1 metal layer 1712, 1714, and 1716 is planarized via CMP to form a level top surface and to remove excess metal of the M1 metal layer 1712, 1714, 1716. The material of the metal forming the V0 metal layers 1702, 1704, 1706 and M1 metal layers 1712, 1714, 1716 may include W, Co, Cu, etc.

Figure 18A:
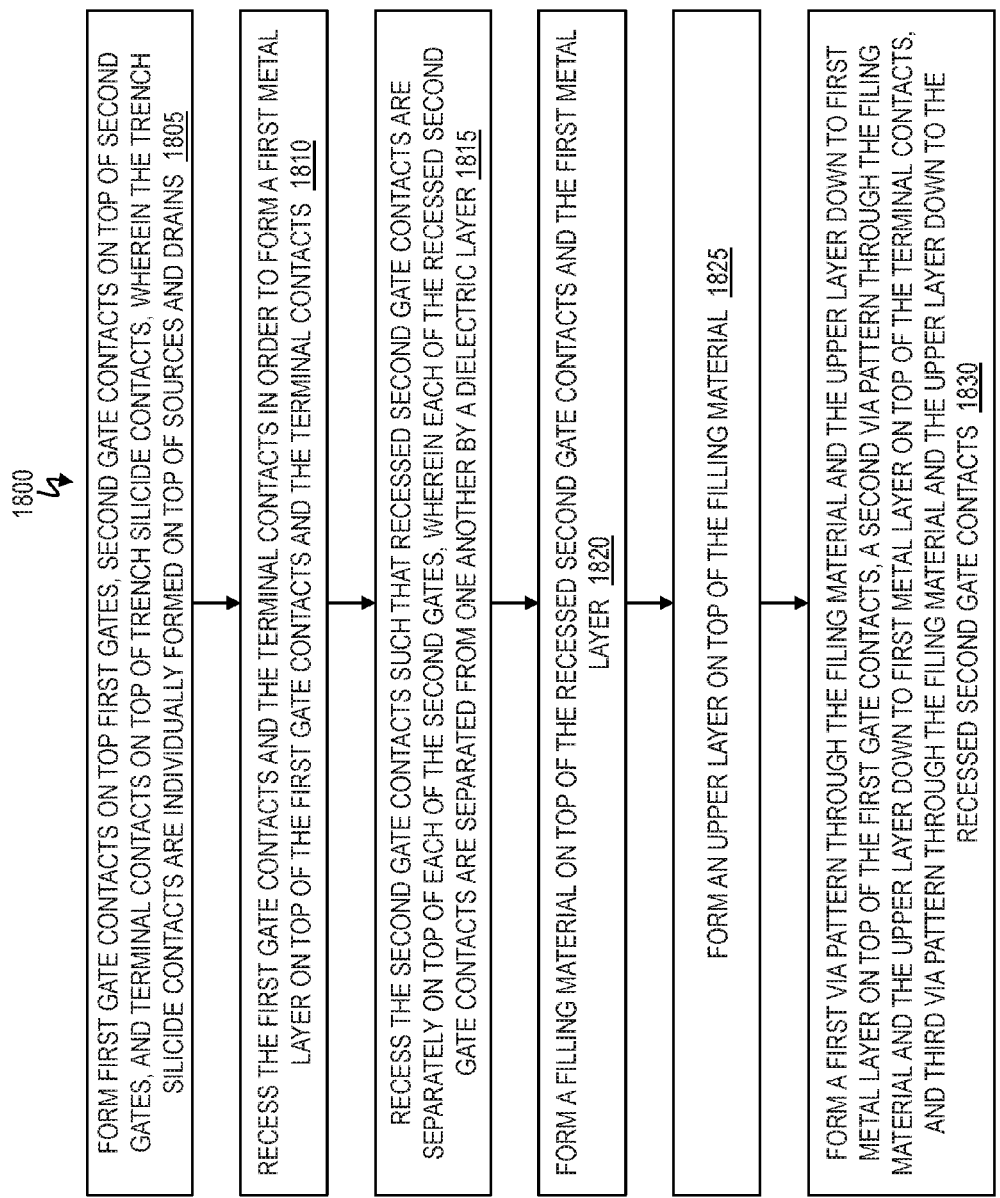
FIGS. 18A and 18B together illustrate a flow chart of a method of forming an integrated circuit according to one or more embodiments.
Figure 18B:
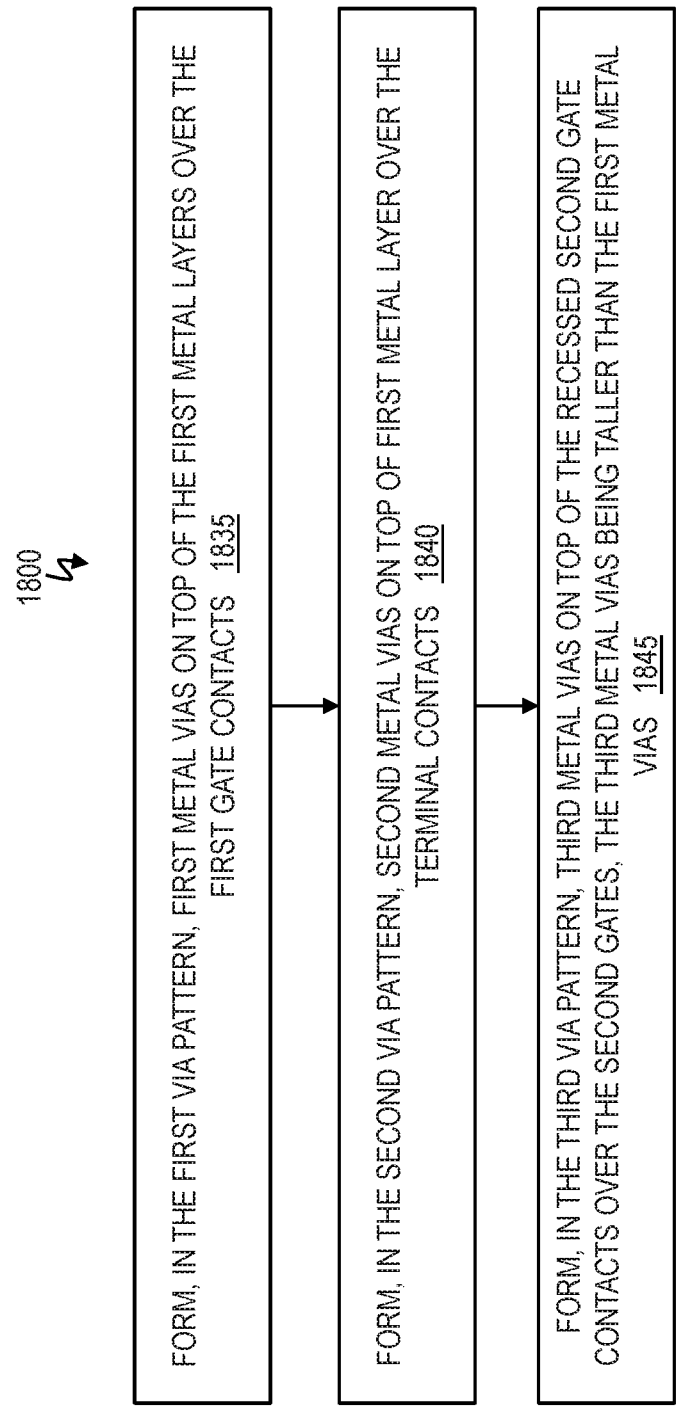

FIGS. 18A and 18B together illustrate a flow chart of a method 1800 of forming contacts for semiconductor devices (which may be an integrated circuit, such as, e.g., integrated circuit 100), according to one or more embodiments. Reference can be made to FIGS. 1-17.

At block 1805, first gate contacts 806 are formed on top first gates 212, second gate contacts 802 are formed on top of second gates 212, and terminal contacts (e.g., source/drain contacts 804) are formed on top of trench silicide contacts 302, where the trench silicide contacts 302 are individually formed on top of sources and drains 206. Examples are depicted in FIGS. 8A-8C.

At block 1810, the first gate contacts 806 and the terminal contacts 804 are recessed in order to form a first metal layer 1104, 1102 on top of the first gate contacts 806 and the terminal contacts 804. Examples are depicted in FIGS. 10A-10C.

At block 1815, the second gate contacts 802 are recessed such that recessed second gate contacts 802 are separately on top of each of the second gates 212, where each of the recessed second gate contacts 802 are separated from one another by a dielectric layer (e.g., interlayer dielectric layer 214). Examples are depicted in FIGS. 13A-13C.

At block 1820, a filling material 1402 is formed on top of the recessed second gate contacts 802 and the first metal layer 1102, 1104. At block 1825, an upper layer 1502 is formed on top of the filling material 1402. Examples are depicted in FIGS. 14A-14C and 15A-15C.

At block 1830, a first via pattern 1602 is formed through the filling material 1402 and the upper layer 1502 down to first metal layer 1104 on top of the first gate contacts 806, a second via pattern 1606 is formed through the filling material 1402 and the upper layer 1502 down to first metal layer 1102 on top of the terminal contacts 804, and third via pattern 1604 is formed through the filling material 1402 and the upper layer 1502 down to the recessed second gate contacts 802.

At block 1835, in the first via pattern 1602, first metal vias 1702 are formed on top of the first metal layers 1104 over the first gate contacts 806.

At block 1840, in the second via pattern 1606, second metal vias 1706 are formed on top of first metal layer 1102 over the terminal contacts 804.

At block 1845, in the third via pattern 1604, third metal vias 1704 are formed on top of the recessed second gate contacts 802 over the second gates 212, where the third metal vias 1704 are taller than the first metal vias 1702. Examples are depicted in FIGS. 16A-16C and 17A-17C.

A height of the third metal vias 1704 corresponds to a thickness of the filling material 1402. Each of the second gates 212 has side layers (layer 210) on sides of the second gates.

The recessed second gate contacts 802 are formed on top of the second gates 212 along with the side layers 210. The side layers 210 include nitride.

The second gates 212 are formed at individual gate locations A, B, C. Recessing the second gate contacts causes the recessed second gate contacts 802 to have a lower height than the dielectric layer 214 at the individual gate locations A, B, C.

Each of third metal vias 1704 is formed on top of a separate one of the recessed second gate contacts 802 over the second gates 212, such that the second gates 212 at locations A, B, C are electrically separated from one another.

A height of the third metal vias 1704 ranges from about 60-100 nanometers. A height of the first metal vias 1702 ranges from about 10-40 nanometers.

The sources and drains 206 include an epitaxy layer on top. The filling material includes nitride. The dielectric layer includes oxide.

A second metal layer 1712, 1714, 1716 is formed on top of the first metal vias 1702, the second metal vias 1706, and the third metal vias 1704. The second metal layer 1712, 1714, 1716 includes at least one of tungsten, copper, and cobalt. The first, second, and third metal vias include at least one of tungsten, copper, and cobalt.

Technical effects and benefits include improved semiconductor devices, such as, e.g., integrated circuits, on a wafer. The improved integrated circuit improves a computer processor. The technical effects further include forming tall via (V0) metal contacts in the semiconductor device without using an additional gate open (GO) mask, which reduces processing steps and costs. A merged gate contact and metal recess process followed by filling material may be utilized to form the tall via metal contacts.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming contacts for a semiconductor device, the method comprising:
    forming first gate contacts on top of first gates, second gate contacts on top of second gates, and terminal contacts on top of trench silicide contacts, wherein the trench silicide contacts are individually formed on top of sources and drains;
    recessing the first gate contacts and the terminal contacts in order to form a metal layer on top of the first gate contacts and the terminal contacts;
    recessing the second gate contacts such that recessed second gate contacts are separately on top of each of the second gates, wherein each of the recessed second gate contacts are separated from one another by a dielectric layer;
    forming a filling material on top of the recessed second gate contacts and the metal layer;
    forming an upper layer on top of the filling material;
    forming first metal vias on top of the metal layer over the first gate contacts, according to a first via pattern through the filling material and the upper layer down to the metal layer on top of the first gate contacts;
    forming second metal vias on top of the metal layer over the terminal contacts, according to a second via pattern through the filling material and the upper layer down to the metal layer on top of the terminal contacts; and
    forming third metal vias on top of the recessed second gate contacts over the second gates, according to a third via pattern through the filling material and the upper layer down to the recessed second gate contacts, the third metal vias being taller than the first metal vias.

2. The method of claim 1, wherein a height of the third metal vias corresponds to a thickness of the filling material.

3. The method of claim 1, wherein each of the second gates has side layers on sides of the second gates.

4. The method of claim 3, wherein the recessed second gate contacts are formed on top of the second gates along with the side layers.

5. The method of claim 4, wherein the side layers include nitride.

6. The method of claim 1, wherein the second gates are formed at individual gate locations.

7. The method of claim 6, wherein recessing the second gate contacts causes the recessed second gate contacts to have a lower height than the dielectric layer at the individual gate locations.

8. The method of claim 1, wherein each of third metal vias is formed on top of a separate one of the recessed second gate contacts over the second gates.

9. The method of claim 1, wherein a height of the third metal vias ranges from about 60-100 nanometers.

10. The method of claim 9, wherein a height of the first metal vias ranges from about 10-40 nanometers.

11. The method of claim 1, wherein the sources and drains include an epitaxy layer.

12. The method of claim 1, wherein the filling material includes nitride; and
    wherein the dielectric layer includes oxide.

13. The method of claim 1, wherein another metal layer is formed on top of the first metal vias, the second metal vias, and the third metal vias; and
    wherein the another metal layer includes at least one of tungsten, copper, and cobalt.

14. The method of claim 1, wherein the first, second, and third metal vias include at least one of tungsten, copper, and cobalt.

* * * * *